United States Patent
Inomata et al.

(10) Patent No.: US 6,801,295 B2
(45) Date of Patent: Oct. 5, 2004

(54) POST EXPOSURE MODIFICATION OF CRITICAL DIMENSIONS IN MASK FABRICATION

(75) Inventors: Hiroyuki Inomata, Asaki (JP); Osamu Katada, Kawasaki (JP); Masa-aki Kurihara, Sayama (JP); Takeshi Ohfuji, Tokyo (JP); Shiho Sasaki, Sakado (JP); Michiro Takano, Kawasaki (JP)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 10/138,864

(22) Filed: May 3, 2002

(65) Prior Publication Data

US 2003/0059688 A1 Mar. 27, 2003

Related U.S. Application Data

(63) Continuation-in-part of application No. 09/965,280, filed on Sep. 26, 2001.

(51) Int. Cl.$^7$ ............................ G03B 27/00; G03C 5/00
(52) U.S. Cl. ............................ 355/18; 430/30; 430/330
(58) Field of Search ............................ 355/18; 430/30, 430/311, 330; 219/446.1, 497; 356/345

(56) References Cited

U.S. PATENT DOCUMENTS

| | | | |
|---|---|---|---|
| 6,034,771 A | 3/2000 | Rangarajan et al. | |
| 6,100,012 A | 8/2000 | Shi | |
| 6,100,506 A | 8/2000 | Colelli, Jr. et al. | |
| 6,169,274 B1 | 1/2001 | Kulp | |
| 6,235,439 B1 | 5/2001 | Whiting | |

OTHER PUBLICATIONS

Section 2.7 Resists, SPIE Handbook of Microlithography, Micromachining and Microfabrication, vol. 1: Microlithography. [online] [retrieved on Aug. 3, 2001] Retrieved from the Internet <URL:http://www.cnf.cornell.edu/SPIEBook/spie7.htm pp. 1–11.

Negative e–beam resist SAL603–0.45 [online] [retrieved on Aug. 3, 2001] Retrieved from the Internet:<URL:http://www.nanophys.kth.se/nanophys/facilities/nfl/resists/sal603.html pp. 1–3.

Alexei L. Bogdanov, Use of SU–8 Negative Photoresist for Optical Mask Manufacturing MAX–Lab, University of Lund, SE–221 00, Lund Sweden. [online] pp. 1–11. http://www.maxlab.luy.se/beamlines/bld811.

(List continued on next page.)

Primary Examiner—Peter B. Kim
(74) Attorney, Agent, or Firm—Blakely, Sokoloff, Taylor & Zafman LLP

(57) ABSTRACT

A system and method are described for modifying an exposure image in a radiation sensitive layer with a heterogeneous and non-uniform post exposure thermal treatment. The treatment may include providing different thermal flux to different regions of the radiation sensitive layer to concurrently create different temperatures in those regions. The different temperatures may cause different physicochemical transformation of the regions that may be used to reduce critical dimension errors in those regions. A post exposure bake hot plate may be configured to provide heterogeneous radiant energy flux to a radiation sensitive layer by providing adjustable spacers that adjust a separation distance between the hot plate and the layer. The adjustable spacers may be adjusted prior to exposure image modification by using an adjustment plate having openings to provide access to and adjustment of the adjustable spacers.

17 Claims, 17 Drawing Sheets

OTHER PUBLICATIONS

R.D. Allen, G.M. Wallraff, D.C. Hofer and R.R. Kunz; "Photoresists for 193–nm Lithography", IBM Journal of Research and Development, vol. 41, No. 1/2–Optical lithgraphy.[online] [retrieved on Jun. 27, 2001] Retrieved from the Internet: <URL:www.research.ibm.com/journal/rd/411/allen.html pp. 1–10.

SPIE vol. 2512; Masumi Arai, Hiroyuki Inomata, Toshiharu Nishimura, Masa–aki Kurihara and Naoya Hayashi; "Application of Chemically Amplified Resists to Photomask Fabrication". Micro Products Research Laboratory, Micro Products Division, Dai Nippon Printing CO., Ltd., Japan. pp. 74–87.

SPIE vol. 1086, Advances In Resists Technology and Processing.(1989) Deep UV ANR Photoresists For 248 nm Excimer Laser Photolithography. James W. Thackcray, George W. Orsula, Edward K. Pavelchek, Dianne Canistro; Shipley Co., Inc., Newton Massachusetts. Leonard E. Bogan Jr., Amanda K. Berry, Karen A. Graziano; Rohm and Hass Co., Inc. Philidelphia Pennsylvania. pp. 34–47.

SPIE vol. 2793; A Chemically Amplified Resist Process For 0.25 u M Generation Photomasks; Mikio Katsumata, Hiroichi Kawahira, Minoru Sugara and Satoru Nozawa. MOS LSI Division, Semiconductor Company, Sony Corporation, Japan. pp. 96–104.

POST EXPOSURE MODIFICATION OF CRITICAL DIMENSIONS IN MASK FABRICATION

This application is a Continuation-in-part (CIP) of prior application No: 09/965,280 entitled "POST EXPOSURE MODIFICATION OF CRITICAL DIMENSIONS IN MASK FABRICATION", filed on Sep. 26, 2001.

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the software and data as described below and in the drawings hereto: Copyright© 2001, All Rights Reserved.

BACKGROUND OF THE INVENTION

1. Field of the Invention

The invention relates generally to the field of semiconductor mask fabrication. More particularly, the invention relates to a system and method for fabricating a mask using a post exposure modification of an exposure image.

2. Background Information

Masks are often used to manufacture semiconductor devices and logic products. FIG. 1 illustrates an exemplary lithography system 100 that may be used to manufacture semiconductor devices based on a mask 130. The system 100 includes a radiation source 110 to generate and transmit radiation 120 to the mask 130. The mask 130 contains a circuitry pattern 140 that creates and transmits a patterned radiation 150. Typically the patterned radiation 150 is only a portion of the radiation 120.

The patterned radiation 150 contains circuitry information and is provided to a semiconductor manufacturing process 160. Typically, the patterned radiation 150 is used to selectively print or expose portions of a resist layer and then subsequent processing is used to manufacture a semiconductor device or logic product based on the exposure.

One prior art problem is that the mask 130 and the pattern 140 may have inaccuracies, errors, or both. The inaccuracies or errors may occur due to a number of factors, such as faulty manufacturing equipment, manufacturing equipment that is not properly calibrated, and other factors. Regardless of the cause, the errors are transferred via the patterned radiation 150 to the semiconductor manufacturing process 160 and are incorporated into the manufactured semiconductor devices. This may result in a larger proportion of semiconductor devices that do not meet specifications, that have degraded performance, or that may fail.

BRIEF DESCRIPTION OF THE SEVERAL VIEWS OF THE DRAWINGS

The novel features believed characteristic of the invention are set forth in the appended claims. The present invention is illustrated by way of example, and not by way of limitation, in the figures of the accompanying drawings and in which like reference numerals refer to similar elements. The invention itself, however, as well as a preferred mode of use, will best be understood by reference to the following detailed description of an illustrative embodiment when read in conjunction with the accompanying drawings:

DETAILED DESCRIPTION OF THE INVENTION

In the following description, for the purpose of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Mask Fabrication

The term "mask" will be used to broadly refer to a structure comprising a functional pattern that acts as a selective barrier to the passage of radiation. A mask may be a substantially flat plate having sufficiently radiation transparent portions that transmit radiation to a radiation sensitive layer and sufficiently radiation opaque portions that prevent exposure of certain areas of the radiation sensitive layer, when the layer is positioned relative to the mask and exposed to radiation. The radiation transparent portion may be a support to which a radiation opaque pattern has been applied. For example, the mask may be a transparent quartz plate with a pattern defined by opaque chrome included on one side of the quartz plate. Alternatively, rather than quartz and chrome, the mask may be fabricated from other radiation transparent materials suitable for the intended application, such as glass, plastic, film, and other opaque materials, such as plastics, and other metals.

The pattern may be associated with circuitry to be created on a semiconductor device or logic product, although the invention is not so limited. The term "semiconductor logic product" and similar terms will be used to refer to any digital logic semiconductor product device, including but not limited to digital memory, microprocessors, coprocessors, and core logic chipsets. The semiconductor logic products may be object code compatible with semiconductor logic products of Intel Corporation of Santa Clara, Calif. The pattern may correspond to one of multiple processing layers that are used to manufacture a semiconductor logic product.

Figure 1:
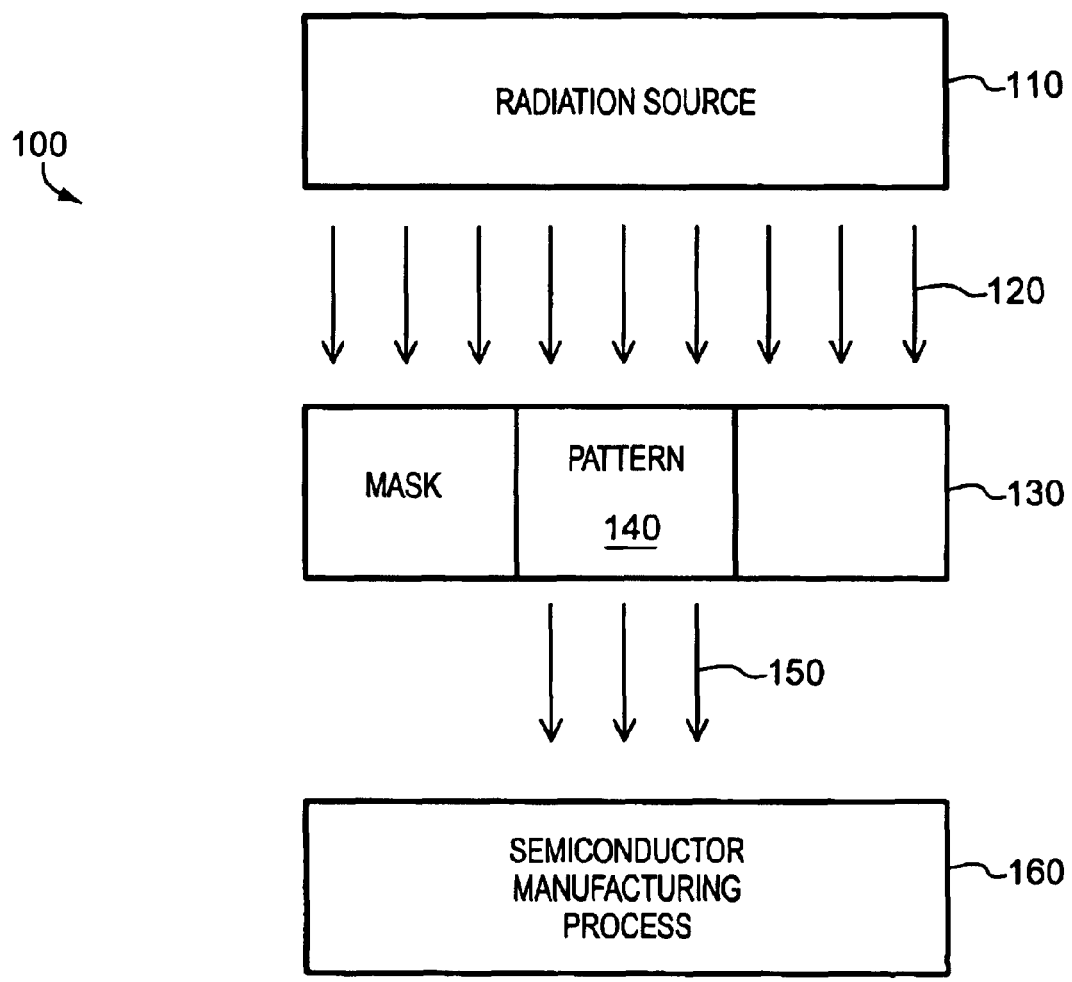
FIG. 1 illustrates a prior art lithography system that uses a mask to manufacture semiconductor devices.
Figure 2:
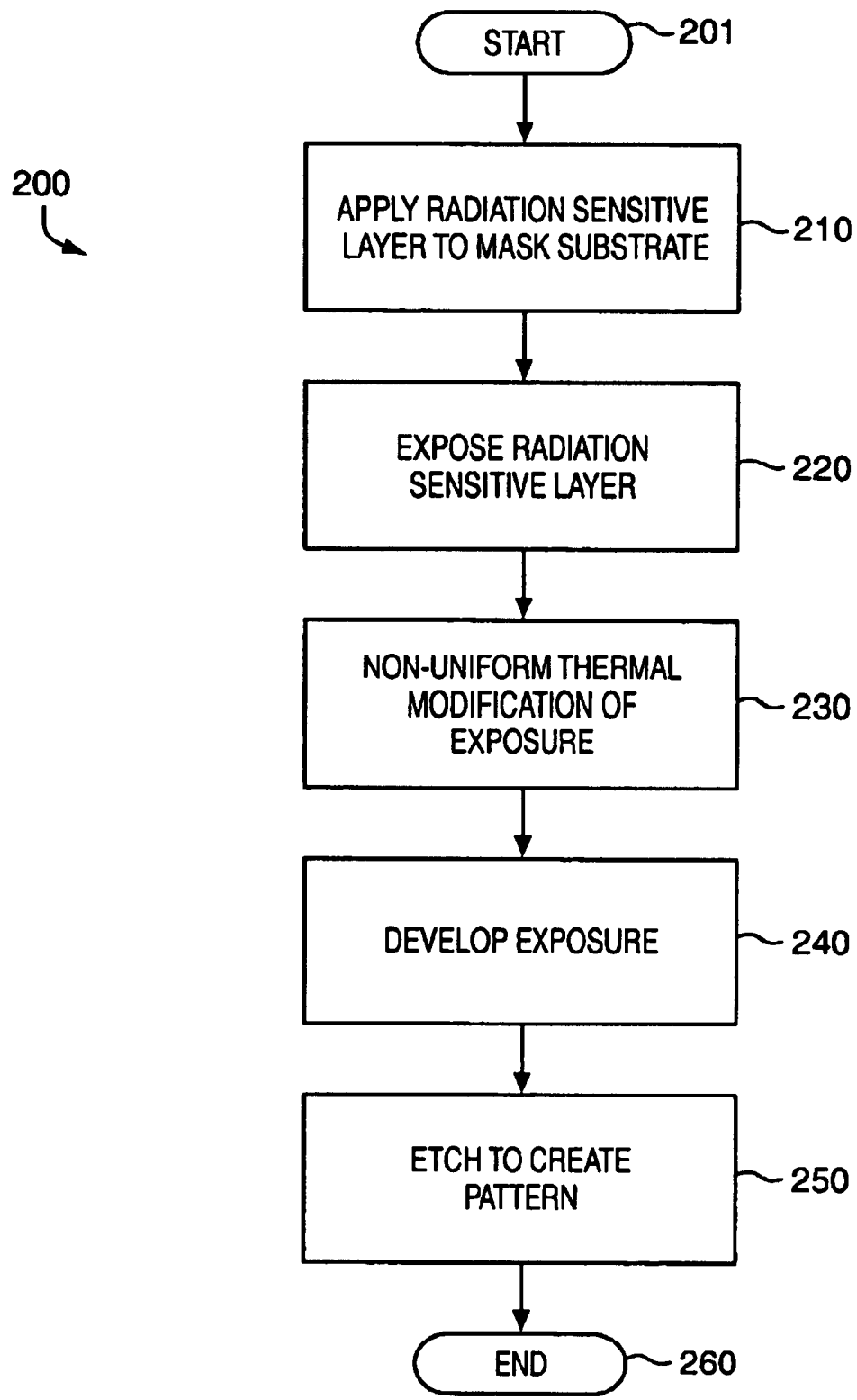
FIG. 2 illustrates a method for making or fabricating a mask, according to one embodiment.

FIG. 2 illustrates in block diagram form a method 200, according to one embodiment, for fabricating a mask. The method commences at block 201, and then proceeds to block 210, where a radiation sensitive layer is applied to a mask substrate. The term "radiation sensitive layer" and similar terms will be used to broadly refer to a layer of material that is physically or chemically transformed when exposed to radiation (e.g., electromagnetic radiation such as light, ultraviolet light, x-rays, etc. or particle beams such as electron beams). Typically, the radiation makes or assists in making the radiation sensitive layer selectively easy or difficult to remove during development. The radiation sensitive layer may be a positive resist in which exposed portions of the layer are transformed to allow them to be easily and selectively removed such as by dissolution in a solvent. Alternatively, the layer may be a negative resist in which exposed resist is transformed to make it comparably difficult to remove.

The radiation sensitive layer may represent a conventional radiation sensitive layer applied by using conventional methods. For example, a mask substrate (e.g., chrome on quartz with an anti-reflective oxide coating) may be pre treated to remove potential contaminants by washing it in deionized water and gently etching it with $O_2$ plasma, and then a layer of resist may be spin coated on the mask substrate to a sufficiently uniform and typically predetermined layer thickness between approximately 100 and 600 nanometers (nm) or preferably about 400 nm. After the resist layer is applied the temperature may be increased for a sufficient time to prepare the layer for subsequent processing. Depending on the particular layer applied, this may be done to dry the layer, evaporate solvents, improve contact with the substrate, promote chemical reactions, or for other reasons. For example, depending on the thermal characteristics of the layer and the solvents, the mask substrate and the radiation sensitive layer may be placed on a hot plate and baked for approximately 5–30 minutes at approximately 80–100° C. to evaporate solvent or preferably for about 25 minutes at about 90° C.

The method advances from block 210 to block 220 where the radiation sensitive layer is exposed to patterned radiation. Conventional patterned radiation generation systems including conventional light and electron beam systems may be used. For example, the radiation sensitive layer may be exposed using an electron beam exposure system having a voltage between approximately 10–100 kV or preferably about 20 kV and an intensity between approximately 1–20 $\mu C/cm^2$ and preferably about 6 $\mu C/cm^2$, and by using mirror operation to shape the patterned radiation.

The patterned radiation exposes or prints a portion of the radiation sensitive layer. Typically the patterned radiation received at the radiation sensitive layer exposes or prints a feature having a critical dimension (CD). The terms "critical dimension", "CD" and similar terms will be used to refer to a dimension or distance associated with a feature or geometry in a pattern. For example, the CD may be a width of a feature (e.g., a line), a separation distance between two features (e.g., a distance between two lines), and other distances in the pattern. The CD may be monitored and compared with a predetermined and specified design dimension as an indication of process performance and to maintain acceptable mask manufacturing standards and tolerances.

The patterned radiation received at the radiation sensitive layer may expose or print a CD having a CD error. The terms "critical dimension error", "CD error" and similar terms will be used to broadly refer to an unintended, undesirable, or erroneous difference between an exposed CD and a predetermined, specified, or desired CD. The CD error may have a type (e.g., undersizing or oversizing) and a magnitude. A mask may have global CD errors in which a type or magnitude of CD errors on the mask have a position dependency on the mask. For example, CD errors may increase in magnitude while moving from right to left along the radiation sensitive layer. Typically, CD errors are not desired and if uncorrected may adversely affect semiconductor devices that are manufactured using the mask.

The method advances from block 220 to block 230 where the radiation sensitive layer is modified by a sufficiently heterogeneous, non-uniform, variable thermal energy interaction. The interaction may include a first thermal energy input to a first region of the exposure layer and a substantially different second thermal energy input to a second region of the exposure layer. Typically, the different thermal energy inputs include different heat flux to the first region and the second region to create different temperatures in the layer at those regions. The term "flux" will be used to refer to an amount of thermal energy transferred to a given region of the radiation sensitive layer per unit of time (e.g., one Joule energy transferred to a square centimeter in one second). These different temperatures may cause sufficiently heterogeneous, non-uniform, and variable physicochemical transformation of the layer and its properties. These heterogeneous physicochemical transformations may alter the exposure image that was previously created in the layer by the processing of block 220. In this way, any desired type of non-uniform thermal energy interaction may be used to modify an exposure image.

Such modifications may be used to modify exposure images, to reduce inaccuracies or errors in the exposure image, to modify CDs, to reduce inaccuracies or errors in the CDs, to actively size or shape CDs, to shrink CDs, and to provide other desired modifications. For example, a first thermal flux may be provided to a first region of the layer containing a first CD having a first CD error of a particular type and magnitude to reduce the first CD error and a substantially different second thermal flux may be provided to a second region of the layer containing a second CD having a second CD error of a different type, magnitude, or both to reduce the second CD error. The different treatments may thus differently modify the type, the magnitude, or both the type and the magnitude of the CD errors by differently changing the sizes of the CDs.

The thermal modification may be provided by a thermal modification system having a variable thermal input capability. Post exposure bake (PEB) systems are often used in conventional mask fabrication to harden the exposed radiation sensitive layer before development by providing uniform and non-variable heat to the radiation sensitive layer.

Properly functioning PEB systems may have very small unintentional temperature variation of typically less than about 1° C. across the surface however they do not provide intentional or sufficiently enough heterogeneous heat flux to modify an exposure image in any desired way. According to one embodiment, the PEB system may be modified or adapted to provide modification of an exposure image by providing heterogeneous heat flux to different portions of the exposure image in addition to its conventional functions. Advantageously, this may allow modification of an exposure image by using modified existing equipment and without introducing a separate processing step.

The method advances from block 230 to block 240 where the layer is developed. Various developments are contemplated to be useful, depending on the particular implementation and the physicochemical properties of the radiation sensitive layer. For example, an aqueous alkaline developer having about 1–5 wt % or preferably about 2–3 wt % solution of tetra methyl ammonium hydroxide (TMAH) may be used to dissolve portions of the layer at substantially room temperature by immersing the layer in a volume of the developer for a time between approximately 3 to 30 minutes, rinsing in fresh solvent, and removing the solvent. Alternatively, other methods and developers including conventional methods and organic solvents (e.g., methyl isobutyl ketone (MIBK)) may be used.

The method advances from block 240 to block 250 where etching is performed to create a mask pattern. For example a metal etchant suitable to remove a chrome layer may be used. This may be performed using conventional materials and methods. The method terminates at block 260.

Modifying Critical Dimensions and Error Reduction

Figure 3:
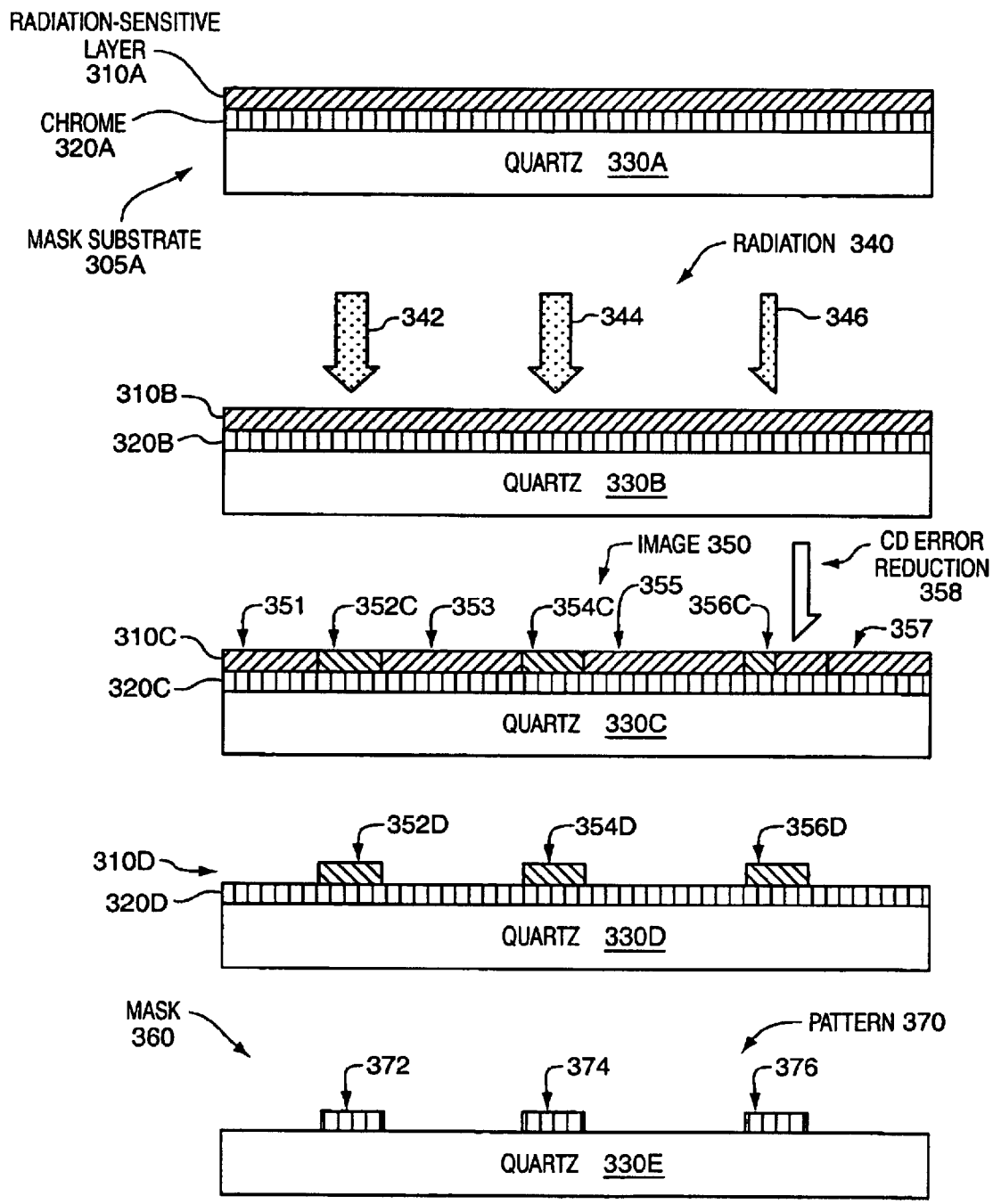
FIG. 3 illustrates mask fabrication processing that incorporates critical dimension error reduction processing, according to one embodiment.

FIG. 3 shows CD error reduction during mask fabrication, according to one embodiment. A radiation sensitive layer 310A is applied to a mask substrate 305A having a layer of chrome 320A on quartz 330A. Electron beam radiation 340 that contains pattern information is transmitted to the radiation sensitive layer 310B. The radiation 340 includes portions 342, 344, and 346 that are each transmitted to different regions of the layer 310B. The radiation portion 346 has an error (conceptually illustrated as a missing half of the radiation portion 346). As shown, the error may suggest loss of radiation due to radiation blockage or transmission errors, although the error is to be regarded more broadly to include additional types of errors that result in CD errors in an exposure image created in the radiation sensitive layer 310B by the radiation portion 346. For example, the error may be due to mispositioning of the radiation 346.

The radiation 340 exposes the radiation sensitive layer 310B to create the radiation sensitive layer 310C having an exposure image 350. The image 350 includes a pattern of exposed and unexposed regions including unexposed regions 351, 353, 355, and 357 and exposed regions 352C, 354C, and 356C. Widths of the exposed regions may be CDs. The radiation portion 346 exposes the region 356C that has a CD error.

The CD error corresponding to the exposed region 356C may be reduced to bring the CD closer to the intended CD by treating a region containing the CD error, a region containing 356C, a region containing 357, or other proximate regions with a CD error reduction 358. As discussed elsewhere, the CD error reduction 358 may create a temperature in the region of the layer 31° C. that it is applied to that is different from temperatures in other regions of the layer 310C. This may cause heterogeneous physicochemical transformation of the layer 310C and the image 350.

After treatment by the CD error reduction 358, the layer 310C is developed. The particular development shown by 310D is characteristic of a negative type layer in which unexposed regions 351, 353, 355, and 357 have been removed and exposed portions 352D, 354D, 356D remain because the exposure, the treatment 358, or both have made them selectively difficult to remove during development. As a result of the CD error reduction 358, a CD of the region 356D has increased and the CD error corresponding to the region 356C has been reduced.

The regions 352D, 354D, and 356D and the layer 320D are etched to create the mask 360 having the pattern 370 including chrome regions 372, 374, and 376 on quartz 330E. The chrome region 376 has a CD that is more similar to the CD of the region 356D than to the CD of the exposed region 356C, due to the CD error reduction 358. Advantageously, the reduction of the CD error by 358 has been carried forward through development and etching processing to provide a mask with an improved pattern. Typically this will lead to improved semiconductor devices.

Exemplary Critical Dimension Errors

Figure 4:
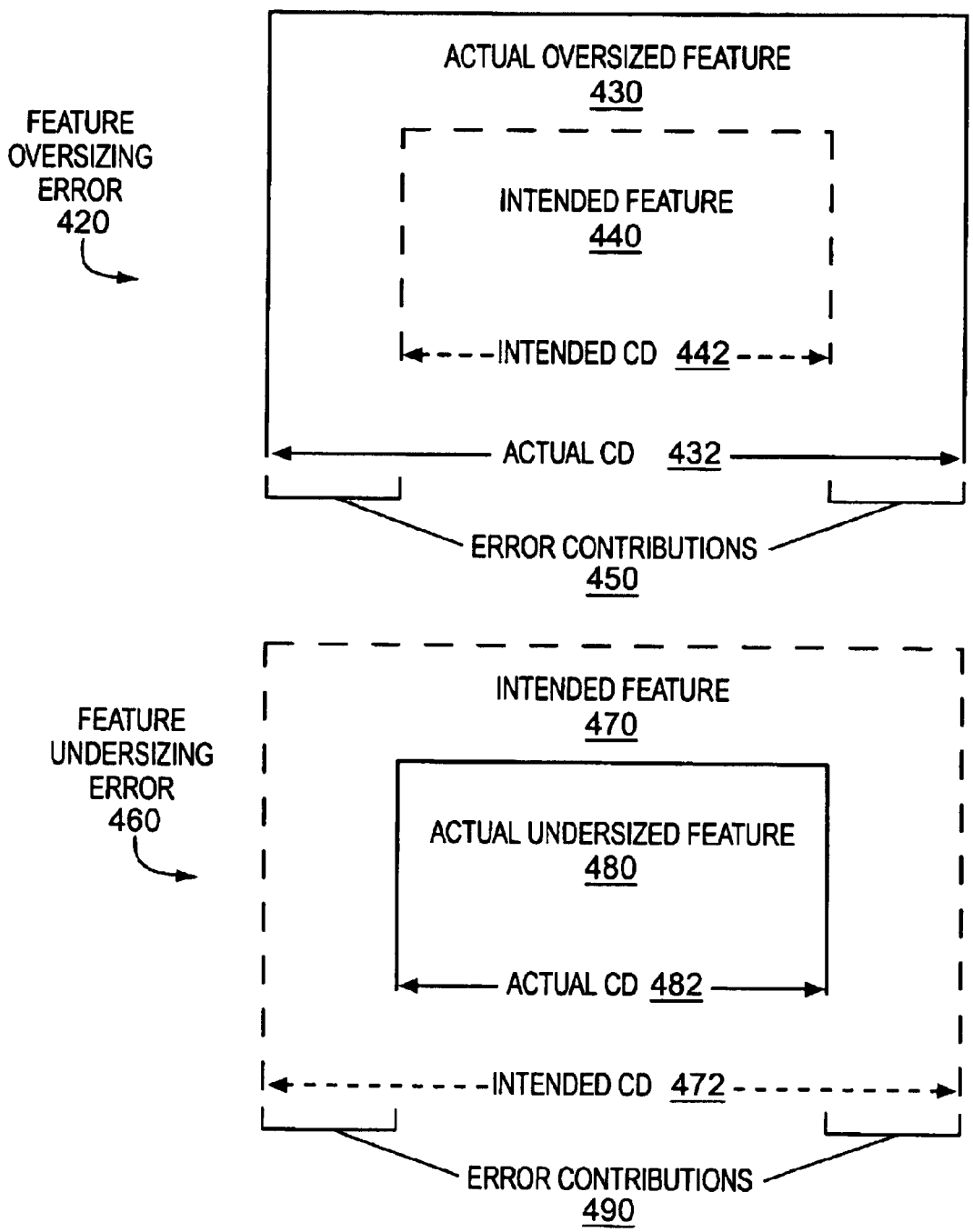
FIG. 4 illustrates different types of critical dimension errors, according to one embodiment.

FIG. 4 shows exemplary CD errors, according to one embodiment. CD errors may be of an oversizing type or an undersizing type and may have different magnitudes of error.

A feature oversizing error 420 is represented by an actual oversized feature 430 that is larger in size than an intended feature 440 indicated by dashed lines. The intended feature may have a size and shape that correspond to a predetermined or specified design pattern. The feature oversizing error may have a magnitude that is related to a difference in size between the actual feature and the intended feature. The actual oversized feature include a CD oversizing error having a magnitude that is related to a difference in dimensional lengths between an actual oversized CD 432 and an intended CD 442. As shown, the CD oversizing error may include potentially unequal error contributions 450. The oversizing errors will also be referred to as positive errors that result from an actual feature or dimension being larger than intended.

A feature undersizing error 460 is represented by an intended feature 470 indicated by dashed lines that is larger in size than an actual undersized feature 480. The feature undersizing error may have a magnitude that is related to a difference in size between the intended feature and the actual feature. The actual undersized feature includes a CD undersizing error having a magnitude that is related to a difference in dimensional lengths between an intended CD 472 and an actual undersized CD 482. As shown, the CD undersizing error may include potentially unequal error contributions 490. The undersizing errors will also be referred to as negative errors that result from an actual feature or dimension being smaller than intended.

Thermal Modification Systems

Figure 5:
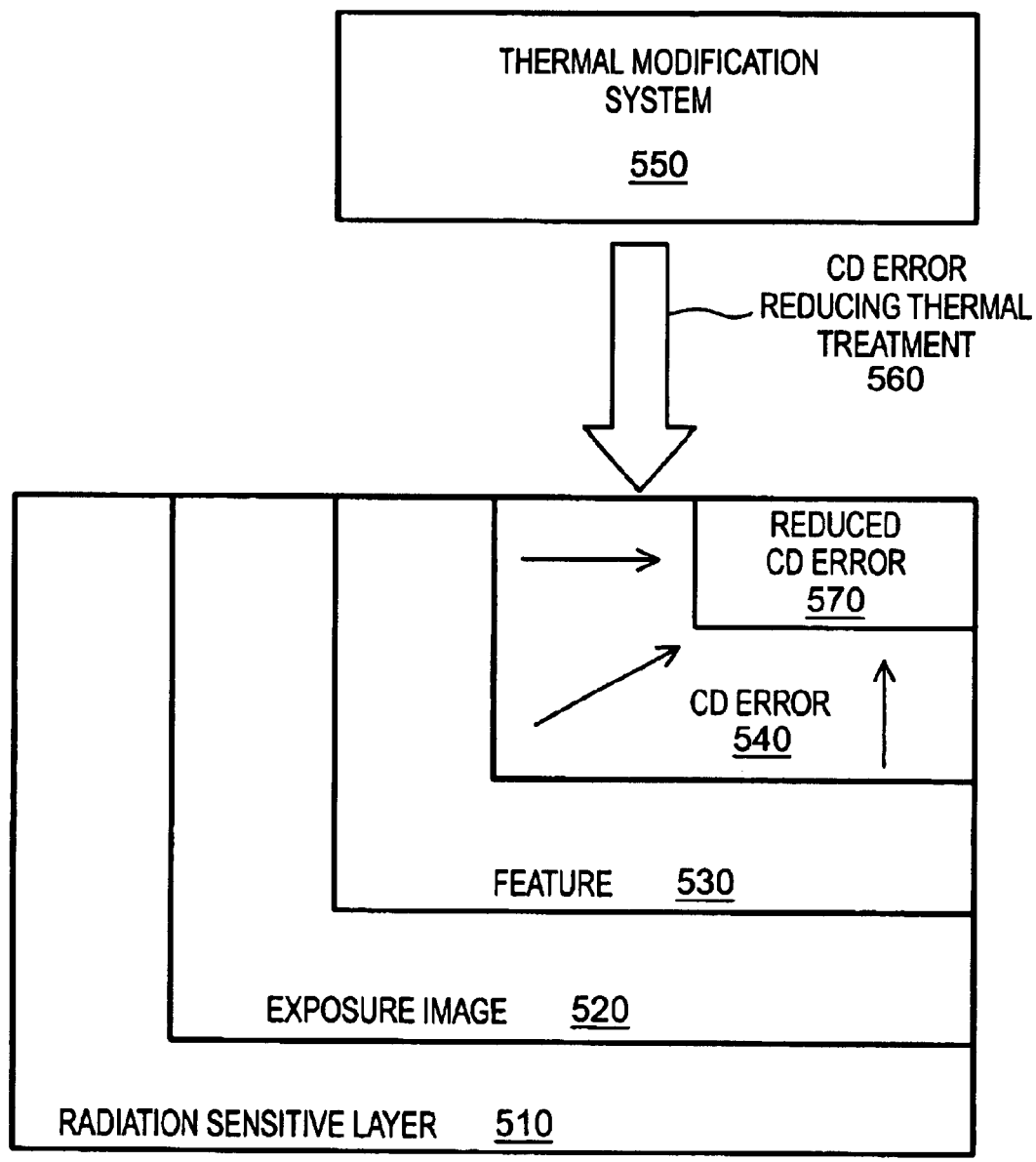
FIG. 5 illustrates a thermal modification system to reduce a critical dimension error, according to one embodiment.

FIG. 5 shows a thermal modification system 550 to reduce a CD error 540 by providing a CD error reducing treatment 560, according to one embodiment. A radiation sensitive layer 510 has an exposure image 520 that includes a feature 530. By way of example, the feature 530 may be associated with an intended circuitry pattern to be created on a mask that is used to create semiconductor devices.

The feature 530 has a CD having a CD error 540. The thermal modification system 550 provides the CD error reducing treatment or dose 560 to a region of the radiation sensitive layer 510 containing the feature 530. The treatment 560 may include a thermal treatment in which thermal energy is used to increase a temperature of the region containing the feature 530. The treatment including a magnitude of thermal energy may be based on a type and magnitude of the CD error. The treatment reduces a magnitude of the CD error as shown by the reduced CD error 570.

Affects of Radiation Sensitive Layer

The thermal treatment may depend upon the physicochemical properties of the radiation sensitive layer. For example, a treatment to reduce a feature oversizing error for a negative acting, chemically amplified resist may be quite different from a treatment to reduce a feature oversizing error for a positive acting, chemically amplified resist.

According to one embodiment, the radiation sensitive layer may be a negative acting, chemically amplified resist that has a chemical species that assists in physicochemical transformation of the layer based on both exposure to radiation and a post exposure thermal path. The chemical species may be a catalyst that is activated by the radiation to facilitate a molecular weight increasing crosslinking reaction physicochemical transformation. The way the chemical species affects the transformation may depend upon crosslinking kinetics, diffusion, catalyst deactivation kinetics and other factors. This crosslinking may lead to reduced solubility and increased permanence during development. Accordingly, it may be possible to modify the transformation by modifying the post exposure thermal path of the chemical species, it may be possible to. Advantageously, such modifications may be used to modify exposure images and reduce CD errors.

An exemplary a negative acting, chemically amplified resist is the SAL-601 resist available from Shipley Company of Marlborough, Mass., a subsidiary of Rohm and Haas Company of Philadelphia, Pa. The SAL-601 resist has a base polymer, a radiation activated acid catalyst generator, and a crosslinking agent. Exposure to radiation may generate an activated catalyst exposure image having regions of radiation activated catalyst and unexposed inactive regions. After exposure, and at sufficiently elevated temperatures, the acid catalyst diffuses and promotes crosslinking reaction between a melamine cross linker on one polymeric chain and a corresponding proximate hydroxide functional group on another polymeric chain. The crosslinking may make exposed regions selectively difficult to remove by aqueous alkaline developer compared with non-exposed regions. The exact way that this transformation takes place may depend upon factors including but not limited to crosslinking reaction kinetics, catalyst diffusion rates, catalyst deactivation rates (catalysts typically deactivate during post exposure bake operations due to thermal decomposition, crosslinking, and other factors).

Such a cross linking process is temperature dependent for at least the reason that the reaction kinetics and diffusion rates are known to be temperature dependent. It follows that the way the temperature of the resist is changed between exposure and development may affect the extent and characteristics of the transformed regions of the resist. Different modifications of the activated catalyst exposure image may be achieved by introducing heterogeneity or non-uniformity into the thermal treatment path of the exposure image. The different treatment path may comprise supplying different thermal fluxes to different portions of the layer to cause the portions to experience different temperature profiles over time, which may cause modification of the crosslinking for those different portions including affecting the density of the crosslinking reactions and affecting the "reach" of the crosslinking at the exposed-unexposed feature edges. For example, temperature scenarios that provide larger total diffusion may increase the extent of the crosslinked region while scenarios that provide smaller total diffusion may decrease the extent of the crosslinked region. Accordingly, layer portions that are exposed to different temperatures at different times may experience and reflect different post exposure thermal modifications. Advantageously, this may be used to affect desirable post exposure modifications of the exposure image, an erroneous critical dimension, or both.

In such a resist it may be possible to reduce both undersizing or negative errors and oversizing or positive errors. In the case of an undersizing or negative CD error, it may be reduced by a high thermal flux treatment that provides a region of the layer containing the undersized feature with substantially more thermal energy in a shorter period of time than a treatment used to reduce a smaller magnitude undersizing CD error, a CD with zero error, or an oversizing CD error. Without limitation, this additional energy may encourage or promote crosslinking near an exposed-unexposed boundary of the undersized CD during a time period before the activity of the acid catalyst is decreased and is no longer available or effective to catalyze the crosslinking reactions. In this way, a high thermal flux treatment may be used to reduce the undersizing CD error by promoting conditions favorable for crosslinking outside of the initial activated catalyst exposure image.

Likewise, an oversizing or positive CD error may be reduced by a low thermal flux treatment that provides a region of the layer proximate to or containing the CD error with substantially less thermal energy than a treatment used to reduce a lesser magnitude CD oversizing error, a CD having zero error, or a CD undersizing error. Without limitation, this reduced energy may discourage or provide less encouragement for crosslinking near an exposed-unexposed boundary of the feature while the catalyst is active. In this way the reach of crosslinking reactions may be confined and reduced compared to other regions that experience higher temperatures resulting from higher thermal energy flux. Such restriction of crosslinking may effectively shrink an oversized CD by restricting its crosslinking growth more than the crosslinking growth of other CDs that receive higher thermal flux are restricted.

According to an alternate embodiment, the radiation sensitive layer may be a positive acting chemically amplified resist having a chemical amplification species that assists in transforming the layer based on exposure and based on post exposure temperature treatment. The resist may operate based on a deprotection mechanism in which exposed portions become selectively easy to remove by development.

An exemplary a positive acting, chemically amplified resist based on the deprotection chemistry is t-butoxycarbonyl (tBOC) resist available from IBM Corporation of Armonk, N.Y. The tBOC resist includes a lipophyllic (oil loving) group and an acid catalyst generator to generate an acid catalyst when exposed to radiation. At elevated temperatures the catalyst may physicochemically transform the resist by cleaving the lipophyllic group to generate a developer soluble hydrophilic group. The transformation depends on temperature making it possible to modify the transformation by modifying the post exposure temperatures in the resist. Different modifications of the exposure image may be achieved by introducing heterogeneity or non-uniformity into the thermal treatment path of the exposure image. Accordingly, treating different portions of the resist with different thermal energy input flux may result in different temperatures in the layer portions at different times, which may in turn result in different "reach" of the cleavage/deprotection transformations and different feature resolutions.

Post exposure thermal modification of other resists is contemplated. For example, it is contemplated that any resist having a post exposure transformation mechanism that is temperature dependent may be modified by a heterogeneous post exposure thermal treatment of different portions of the exposure image. This concept is expected to apply to a wide variety of negative acting resists, positive acting resists, chemically amplified resists, and resists based on transformations involving such temperature dependent mechanisms reactions (e.g., deprotection, depolymerization, rearrangement, intramolecular dehydration, condensation, cationic polymerization) and diffusion.

A simple investigation may be used to determine a post exposure thermal modification for any type of radiation sensitive layer as follows: (1) expose a plurality of features of substantially equal size in the resist, (2) treat a first subset of the plurality with a baseline thermal flux, treat a second subset with a relatively low thermal flux, and treat a third subset with a relatively high thermal flux, and (3) determine whether on average the second subset or the third subset have been enlarged in size relative to the first subset indicating an ability to thermally reduce an undersizing error. As desired, the simple investigation may be succeeded by more sophisticated investigations involving timing of the thermal flux and other parameters.

CD Errors May Depend on Mask Position

Figure 6:
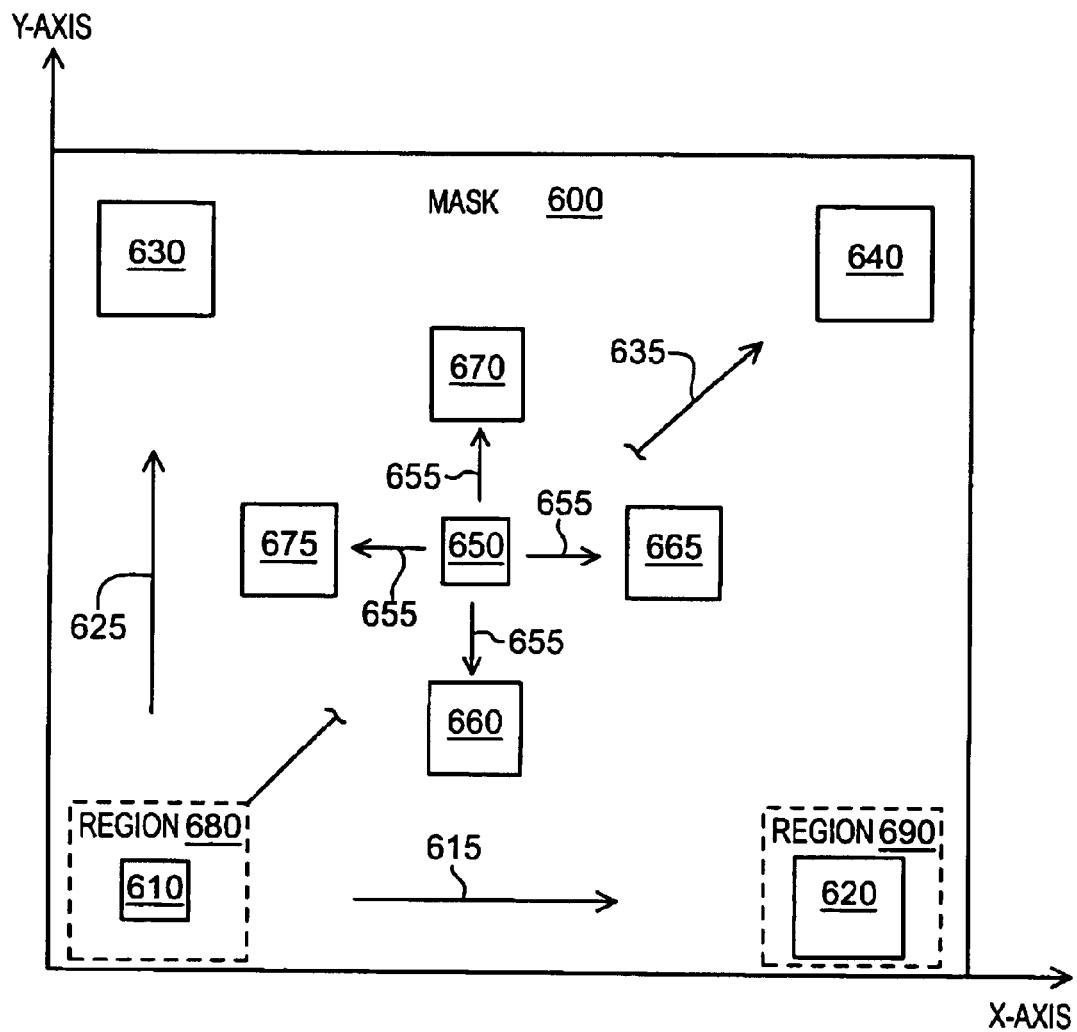
FIG. 6 illustrates critical dimension errors that depend on mask position, according to one embodiment.

FIG. 6 shows that CD errors may depend upon position on a mask 600, according to one embodiment. The type, the magnitude, or both may vary regularly over the mask or some portion thereof. Such errors may be referred to as global CD errors.

The mask 600 includes a reference CD error 610 having a CD error magnitude proportional to the shown size. The mask also includes other CD errors 620, 630, 640 that differ in magnitude from the CD error 610 as a result of their position on the mask. In particular, the CD error 620 is larger than the CD error 610 due to the fact that it is separated from the CD error 610 by some distance along a line 615 parallel to an x-axis. Likewise, the CD error 630 is larger than the CD error 610 due to the fact that it is separated from the CD error 610 by some distance along a line 625 that is parallel to a y-axis. The CD error 640 is larger than the CD error 610 due to the fact that it is separated from the CD error 610 by some distance along a line 635, which may represent any arbitrary line on the mask.

The mask 600 may alternatively have other global CD errors. For example, CD errors 660, 665, 670, and 675 may be larger as shown (or smaller) than the CD error 650 as a result of radial dependency. The above description has discussed individual CD errors, although it is commonly the case that regions such as region 680 have CD errors that on average are larger (or smaller) than other regions such as region 690.

Reduction of Drifting CD Errors

Exposure image modification may be used to improve mask fabrication by monitoring CD errors in previously fabricated masks and using this monitoring intelligence to adjust thermal modification systems to perform CD error reduction, according to one embodiment. Table 1 contains exemplary CD error data collected during mask fabrication.

| DAY | CD ERROR INCREASE IN X-DIRECTION (NANOMETERS) | CD ERROR INCREASE IN Y-DIRECTION (NANOMETERS) |
| --- | --- | --- |
| Jun. 13, 2001 | A | B |
| Jun. 20, 2001 | 0.1A | 2.5B |
| Jun. 27, 2001 | 0.5A | −2B |
| Jul. 04, 2001 | −A | −1.5B |
| Jul. 11, 2001 | −A | −4B |

The first column includes days that multiple masks were fabricated by CD error introducing mask fabrication equipment. The second and third columns include daily CD error data in terms of A and B, where A and B represent an arbitrary CD error increase in the x-direction and y-direction on the date Jun. 13, 2001. More particularly, the second column includes an average increase in CD error along the mask as x is increased from x=0 to x=$x_{max}$. The third column includes a similar increase as y increases from 0 to $y_{max}$.

As shown, the average magnitude and positional dependency of CD errors may drift or change over time. For example, as shown in Table 1, initially the CD error increased across the mask in both the x and the y-directions, whereas later the CD error tended to decrease as x and y approach $x_{max}$ and $y_{max}$, respectively. This type of knowledge of prior CD errors may be used to perform CD error reduction. For example, in the case of substantially CD undersizing errors and a negative type chemically amplified resist, CD error reduction processing for day Jul. 2, 2001 may be anticipated by applying more thermal energy to a CD errors close to (0, 0) and comparatively less energy to CD errors close to ($x_{max}$ and $y_{max}$).

CD Error Reduction by Adjusted Thermal Input

Figure 7:
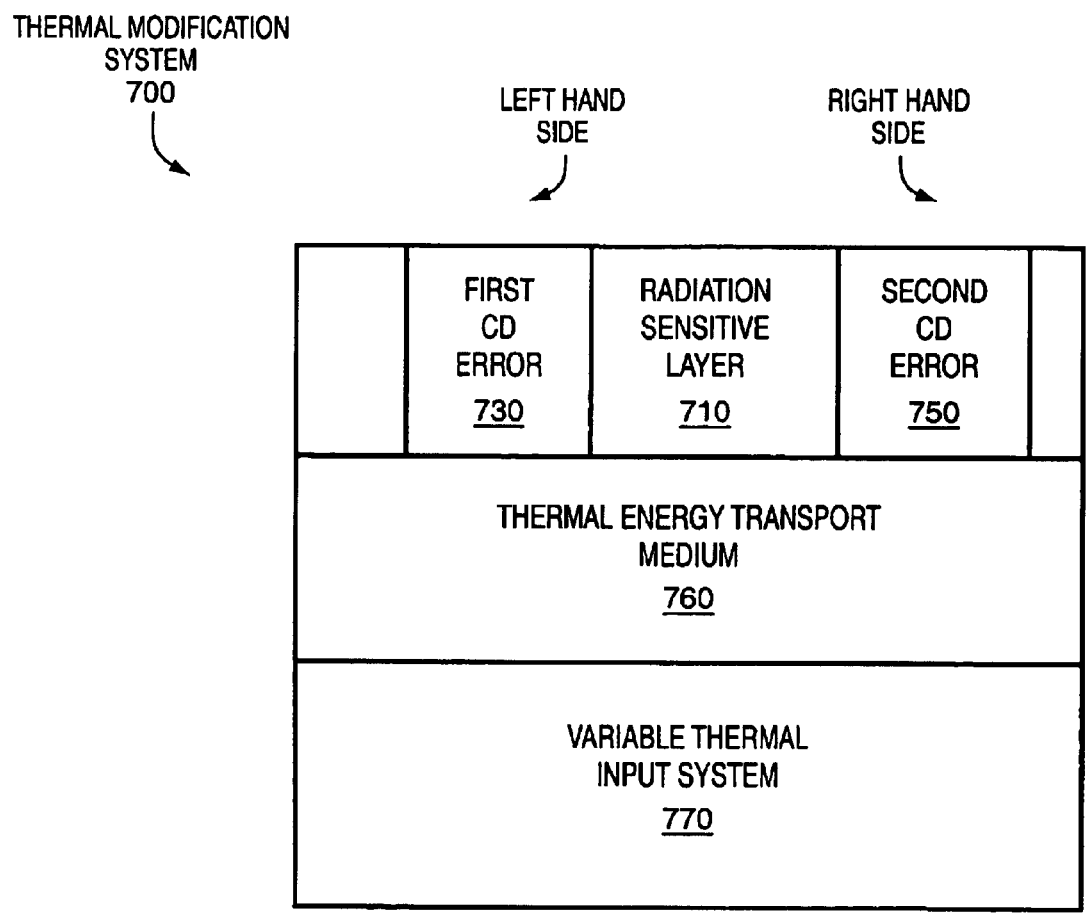
FIG. 7 illustrates a thermal modification system having a variable thermal input, according to one embodiment.

FIG. 7 shows a thermal modification system 700 that may be used to reduce a CD error, according to one embodiment. The system includes a radiation sensitive layer 710 coupled to a thermal energy transport medium 760 coupled to a variable thermal input system 770 to reduce a CD error of the layer 710 by transferring different amounts of thermal energy to the radiation sensitive layer via the transport medium.

The radiation sensitive layer has a first CD error 730 on a left hand side of the system 720 and a second CD error 750 on a right hand side of the system 740. The thermal energy transport medium may be any medium able to conduct thermal energy. For example, the thermal energy transport medium may include a layer of chrome on a layer of quartz. Depending on the particular implementation, the medium 760 may include other medium such as a gas filled void interface to the system 770. As desired, the medium 760 may provide a sufficiently consistent and uniform heat flux to the layer 710.

By way of example, the radiation sensitive layer 710 may be a negative type, chemically amplified resist having an acid catalyst to diffuse and promote crosslinking reactions. Based on knowledge or estimation that the first CD error is a CD undersizing error, the variable thermal input system may be adjusted, configured, or instructed to reduce the first CD error by providing a high thermal energy flux treatment on the left hand side. That is, the CD undersizing error 730 may be reduced by a thermal modification system that includes a variable thermal input system to provide comparatively more energy flux to the undersizing error 730 compared to a CD with less undersizing error, no CD error, or CD oversizing error.

Alternatively, the second CD error 750 may be a CD oversizing error that may be reduced by a low thermal energy flux on the right hand side 740. That is, the CD oversizing error 750 may be reduced by a system to provide comparatively less flux to the oversizing error 750 compared to the flux provided to a CD with less oversizing error, substantially no CD error, or CD undersizing error.

Different types of variable thermal input system 770 are contemplated. Examples of a system to provide variable conductive heat energy, variable convective heat energy, and radiant heat energy are discussed below. Other examples are contemplated.

As a first example, the system 770 may provide variable thermal input by conduction from a surface with variable, non-uniform temperatures that are each controlled by a temperature control system having a different temperature setpoint. The different temperature setpoints may each correspond to a different region of the layer 710, such as a quadrant region, a grid, a radial grid, or other regions.

As a second example, the system 770 may provide variable thermal input by forced or natural convection. In the case of forced convection gas having different temperatures may be provided to different regions or different flow rates of a similar temperature gas may be provided to different regions. Alternatively, this may be performed by natural convection by contacting a gas in a natural convection zone with surfaces having different temperatures or different heat transfer coefficients.

As a third example, the system 770 may provide variable radiant heat energy to the layer 710 by radiant heat lamp, radiant flux from a hot surface, or other means. In the case of a radiant heat lamp, radiant thermal input may be provided by an infrared heat lamp to deliver different intensities to different regions of the layer 710, different exposure durations to different regions, different wavelengths of radiation to different regions, or otherwise.

The radiant energy input may also be provide by radiant heat flux from a hot surface. Variation and non-uniformity in the radiant heat flux may be achieved by different approaches. A first approach involves providing a hot surface having variable and non-uniform temperatures. The radiant heat flux from such a surface may be correspondingly variable and non-uniform to transfer different thermal energy to different regions of the layer 710 causing different temperatures to be achieved in those regions. For example, the surface may have a high temperature right hand side that provides the right hand side with a high radiant energy flux and a comparatively lower temperature left hand side that provides the left hand side with a lower flux of radiant energy.

A second approach involves providing a different separation distance between a hot surface having substantially uniform temperature and the layer 710. The magnitude of radiant heat energy transferred to the layer 710 by the hot surface will decrease as separation distance between the layer 710 and the hot surface increases. This makes it possible to adjust the amount of radiant heat energy provided to a region of the layer 710 by adjusting a separation distance between the region of the layer 710 and corresponding proximate regions of the hot surface. This makes it possible to achieve different temperatures in a first region containing the first CD error and a second region containing the second CD error by adjusting different separation distances between those regions and the corresponding regions of the variable thermal input system that transfer the most direct radiant energy flux to those regions. As will be explained further below, this may be achieved by providing one or more height adjustable spacers to adjust a separation distance between a portion of the layer 710 and a variable thermal input system having a substantially uniform temperature post exposure bake hot plate surface.

Thermal Modification System having Adjustable Spacers

Figure 8:
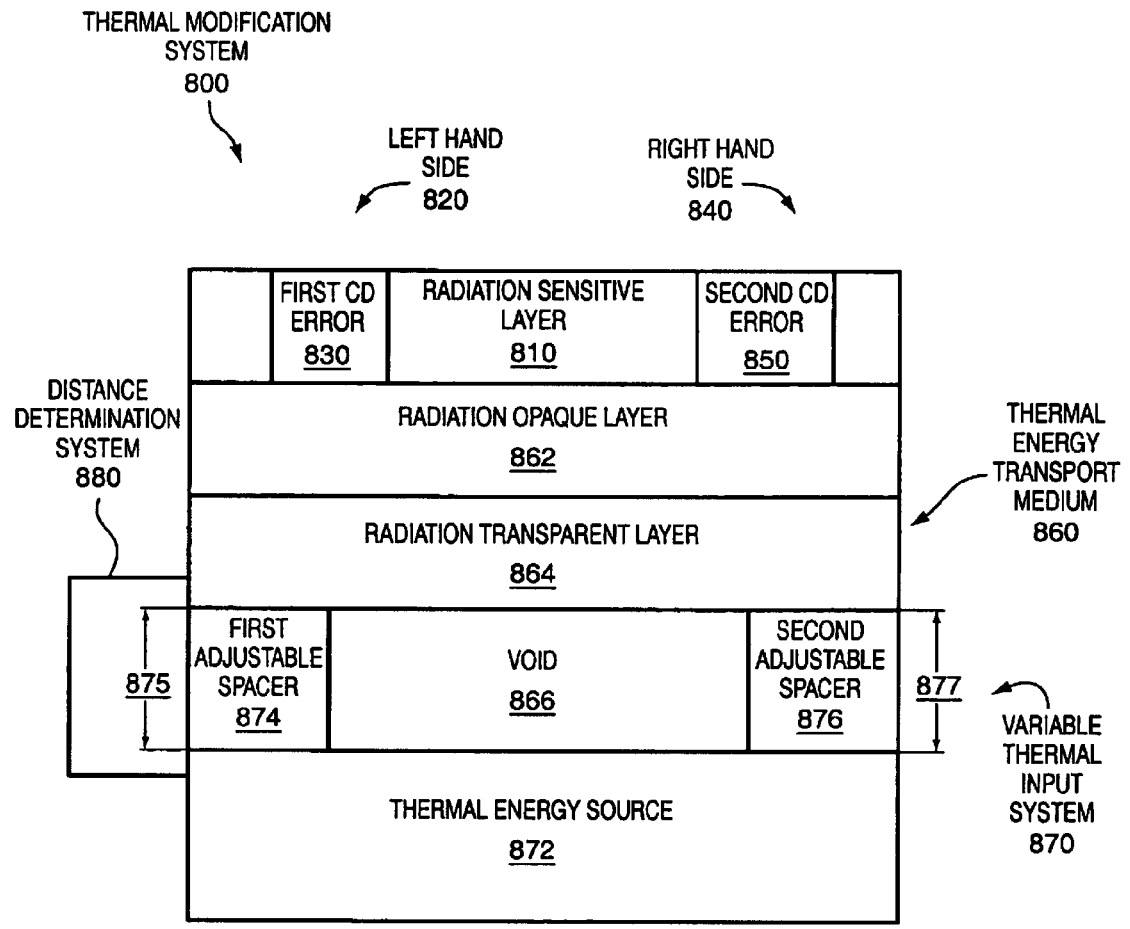
FIG. 8 illustrates a thermal modification system having an adjustable spacer, according to one embodiment.

FIG. 8 shows a thermal modification system 800 having adjustable spacers that may be used to reduce a CD error, according to one embodiment. The system includes a radiation sensitive layer 810 coupled to a thermal energy transport medium 860 that is in turn coupled to a variable thermal input system 870. The thermal energy transport medium includes a radiation opaque layer 862 (e.g., chrome) attached to a radiation transparent layer 864 (e.g., quartz) and a void 866 that may be filled with a gas (e.g., air). The variable thermal input system includes a thermal energy source 872, a first adjustable spacer 874 having a separation distance 875, a second adjustable spacer 876 having a separation distance 877, and a distance determination system 880. The thermal energy source transmits radiant energy to the thermal energy transport medium including different distances through the void based on the different separation distances 875 and 877. In one embodiment the thermal energy source 872 is brought to a substantially uniform baking temperature of about 90° C. Based on the different separation distances and different regions of the radiation sensitive layer receive different radiant energy inputs and achieve different temperatures that as discussed may advantageously be used to modify exposure images and reduce CD errors.

The first spacer 874 and the second spacer 876 couple the thermal energy source to the radiation transparent layer (or some other structure that supports the radiation transparent layer) at the respective separation distances 875 and 877. Increasing the distances 875 and 877 causes less radiant energy to be transmitted to the layer 810. Likewise decreasing the distances 875 and 877 causes more radiant energy to be transmitted to the layer 810. Variable and non-uniform radiant energy is transferred to the left hand side 820 and the right hand side 840 when the distances 875 and 877 are different. For example, more energy is transferred to the right hand side 840 of the layer 810 when the distance 877 is less than the distance 875. Without limitation, the amount of radiant heat energy transferred to the right hand side 840 of the layer 810 may vary substantially proportionally to the square of the distance 877. As shown, the spacers 874 and 876 may be located near extremities such as sides or corners of the thermal energy source.

CD error reduction of a first CD error 830 and a second CD error 850 may be based on the layer 810, type of CD error, and magnitude of CD error. For example, for a negative acting, chemically amplified resist having a large magnitude undersizing CD error 830 and a small magnitude undersizing CD error 850 the first adjustable spacer 874 may be adjusted to decrease the distance 875 compared to the distance 877 to cause more radiant energy to be transmitted to the CD error 830 than to the CD error 850.

The first and second adjustable spacers 874 and 876 may be any type of spacers sufficient to couple the radiation sensitive layer with the thermal energy source at adjustable separation distances 875 and 877. The spacers may be able to accurately and reliably adjust the separation distances by increments that are desired for the particular implementation. For example, depending on the particular implementation, the spacers may be able to reliably adjust the distances with an accuracy better than about 50 micrometers or preferably better than about 5 micrometers.

Typically, the spacers 874 and 876 receive energy and do work by adjusting the heights 875 and 877, respectively. The spacers may be mechanically adjustable and they may receive mechanical energy (e.g., rotational, translational, pressure/volume, or other conventional forms) from a human or device (e.g., a motor) and adjust the heights to change the distance of separation of the radiation sensitive layer and the thermal energy source. For example, the spacers may be jacks that are adjustable based on translational energy applied through a lever or rotational energy applied through a gear, pistons that are adjustable based on pressure, screws that are adjustable and provide linear motion based on rotational energy input, nails or spikes that are adjustable by translational energy, and by other conventional height adjusting systems.

According to an alternate embodiment, the spacers 874 and/or 876 are electrically adjustable spacers that receive electrical energy directly and adjust the heights 875 and/or 877. For example, the spacers may be piezoelectric spacers that generate a particular predetermined mechanical force associated with a distance that corresponds to an input voltage.

The spacers 874 and/or 876 may be made of different materials of construction including but not limited to metals (e.g., stainless steel, aluminum, chrome), plastic (e.g., polystyrene), ceramic, glass, quartz, or other materials. The desired material may have a sufficiently low thermal conductivity to reduce conductive heat transfer from the thermal energy source to the radiation sensitive layer. Alternatively, a low conductivity insulating spacer may be functionally coupled between the energy source 872 and the layer 810. For example, a piece of polyamide or an o-ring may be attached to a top of the spacer 874 to contact the radiation transparent layer 864.

The system 800 may include a distance determination system 880 to determine or measure a distance associated with the spacer 874. Conventional distance measurement systems and methods may be used. For example, the distance determination system may be an electrical measurement system that measures an electrical property such as conductance, resistance, capacitance, or another property of a length of void 866 associated with the distance 875. Alternatively, a laser based system may be used to measure the distance. The distance measurement system may include a scale of distance intervals, such as a ruler has. Desirably the distance determination system will be able to measure distances within a resolution that affects has an affect on temperatures created in the radiation sensitive layer. For example, the distance determination system may be able to accurately measure distances with an error of less than about 5 $\mu$m or preferably less than about 2 $\mu$m.

The thermal energy source 872 may be a thermal energy source to supply conventional forms of thermal energy such as conduction, convection, and radiation. The thermal energy source may be a temperature elevated radiant energy source that transmits radiant energy through the medium 860, including the void 866 which may contain gas (e.g., nitrogen, air, dry air, etc.) to transmit the radiant energy to the radiation sensitive layer 810 via the layers 864 and 862. For example, the thermal energy source may be similar to a hot plate to draw electrical energy from an electrical energy source (e.g., an outlet, a generator, or a battery) and provide the electrical energy to an electrical energy to thermal energy conversion means such as a heat coil, a resistor, or others. Alternatively, the thermal energy source may include a lamp (e.g., a radiant energy lamp or an infrared lamp).

Exemplary Temperature Profiles

Figure 9:
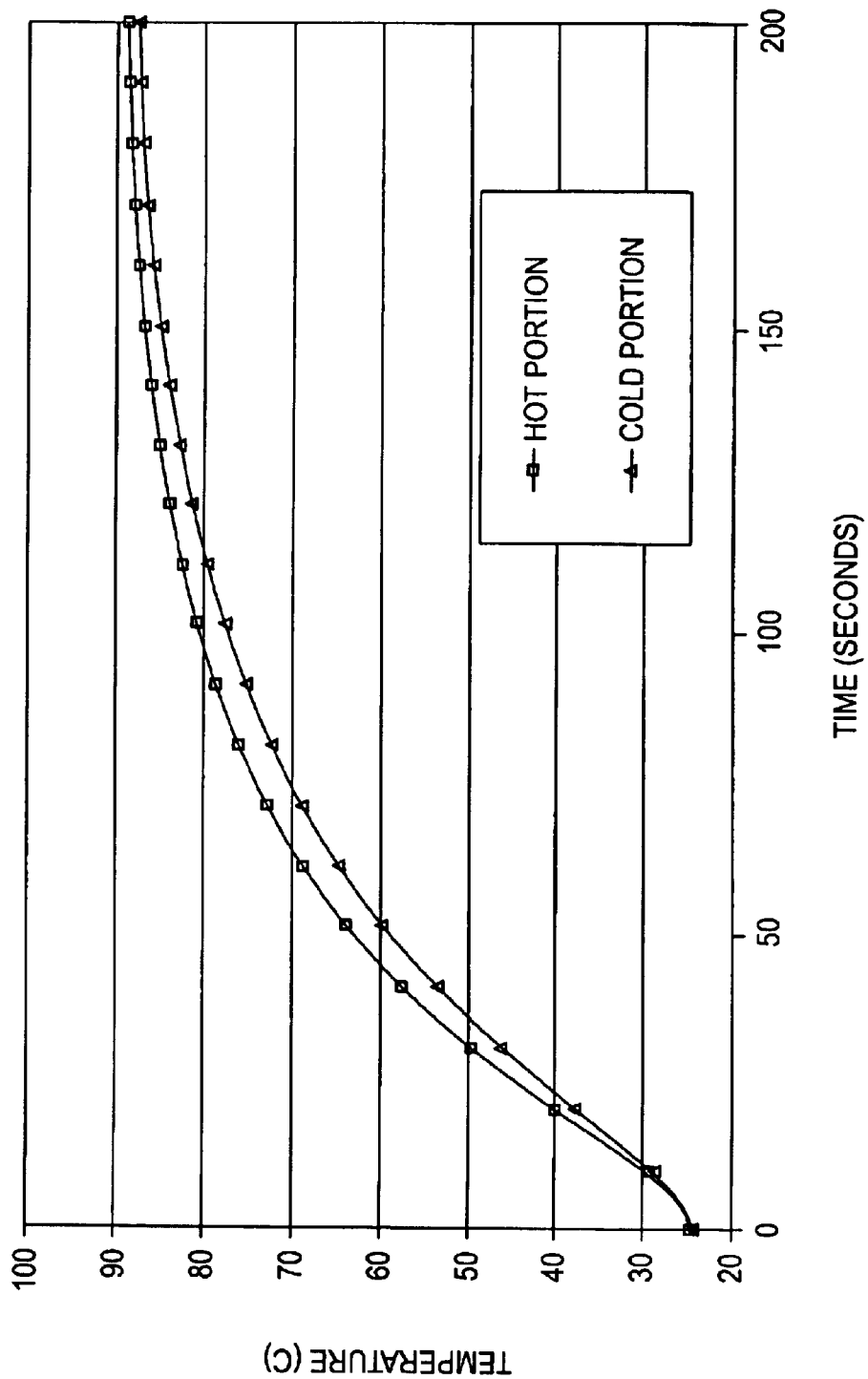
FIG. 9 illustrates exemplary temperatures for a post exposure thermal treatment, according to one embodiment.

FIG. 9 shows exemplary temperature profiles for post exposure thermal treatment of a radiation sensitive layer, according to one embodiment. The two curves, one indicated by open boxes and one by open triangles, show different temperatures achieved in the radiation sensitive layer at different times as a result of a heterogeneous, non-uniform post exposure thermal treatment of the radiation sensitive layer.

As shown by the curves, the temperature of the layer is increased from a starting temperature that may be approximately room temperature to a final temperature that may be approximately 2–5 times, or preferably around 3.5 times higher than the starting temperature, during a period of approximately 3–5 or preferably about 4 minutes. Different portions receive different thermal fluxes and achieve different temperatures at different times. The curve indicated by open boxes is labeled "hot portion" to indicate that it corresponds to a portion of the radiation sensitive layer that receives high thermal fluxes. Likewise, the curve indicated by open triangles is labeled "cold portion" to indicate that it corresponds to a portion that receives lower thermal fluxes and achieves a relatively lower temperature. The difference in temperature varies from near zero initially to a desired larger value during the period indicated above. A particular maximum difference of about 5° C. is shown, although larger or smaller differences are contemplated to be useful for modifying other layers. For example, a maximum difference of about 10° C. may be used for a layer having greater variation in CD error magnitude.

The initial time portions at temperatures above approximately 50–70° C. may more strongly affect modifications of the exposure image than previous times at lower temperatures or subsequent times at higher temperatures. In the case of the Shipley resist, the crosslinking reactions may be slow at temperatures below 40° C. and at subsequent higher temperatures and longer times the catalyst may be deactivated or bound by crosslinked regions. Accordingly, difference between the two curves during these periods may be used to affect heterogeneous modifications of the exposure image. In particular, the differences may be effective to differently balance kinetic acceleration of crosslinking reactions, diffusion of acid catalyst, and acid catalyst deactivation in resists, such as the Shipley SAL resist, which may lead to exposure image modification. For example, such a heterogeneous thermal post exposure treatment of the layer may be used to "grow" an undersized feature with the hot treatment and comparably "shrink" an oversized exposure feature in a negative type, chemically amplified resist, such as the Shipley SAL resist.

As desired, the higher temperatures may be maintained for a time sufficient to harden the radiation sensitive layer, cure the layer, remove moisture, diffuse radiation sensitive components, and encourage a good develop. For example, the temperature may be maintained at approximately 80–120° C. for approximately 5–30 minutes, or preferably at approximately 90–100° C. for approximately 10 minutes.

Different thermal treatments are also contemplated. In one alternate treatment the temperature is increased more slowly than shown in FIG. 9. For example, the temperature may be increased from approximately room temperature at time zero, to approximately 30–40° C. at one minute, to approximately 70–80° C. at 2 minutes, to approximately 80–90° C. at 3 minutes, and thereafter to approximately 85–95° C. Alternatively, regular temperature rates of change may be preferred. For example, the layer temperature may be subjected to a constant rate of increase, a constant rate of temperature acceleration, or a constant rate of temperature deceleration. Alternatively, rather than these thermal treatments and their equivalents, a person having an ordinary level of skill in the art may determine treatments that are effective for any type of radiation sensitive layer for which an exposure image may be modified post exposure, without undue experimentation, based on the present disclosure, by empirically investigating multiple different temperature ramping profiles and determining which profile achieves the desired exposure image modification.

Table 2 contains example thermal energy gradient data corresponding to the system 800, according to one embodiment. The data may represents the system 800 after one minute of ramping according to the ramping profile of FIG. 9, when the thermal energy source 872 temperature was approximately 60 degrees Celsius.

| DIFFERENCE BETWEEN DISTANCES (MICROMETERS) | DIFFERENCE BETWEEN TEMPERATURES (DEGREES CELSIUS) |
| --- | --- |
| 0 | 0 |
| 15 | 5 |
| 25 | 7 |
| 45 | 10 |
| 70 | 13 |

The first column contains a difference in distance between the radiation sensitive layer 810 and the thermal energy source 872 for different adjustment scenarios. The differences listed in the first column may primarily account for the difference between the distances 875 and 877. The second column contains difference in temperature between a right hand side 840 corresponding to the distance 877 and a left hand side 820 corresponding to the distance 875. As shown, the temperature difference in the second column increases as the distance difference increases. The shorter distance corresponds to the hotter temperature. The temperature difference may be due to a decrease in radiant heat energy reaching the radiation sensitive layer as well as other contributing factors (e.g., free convection due to hot gasses rising from the source 872.

CD Error Reducing Temperatures

Figure 10:
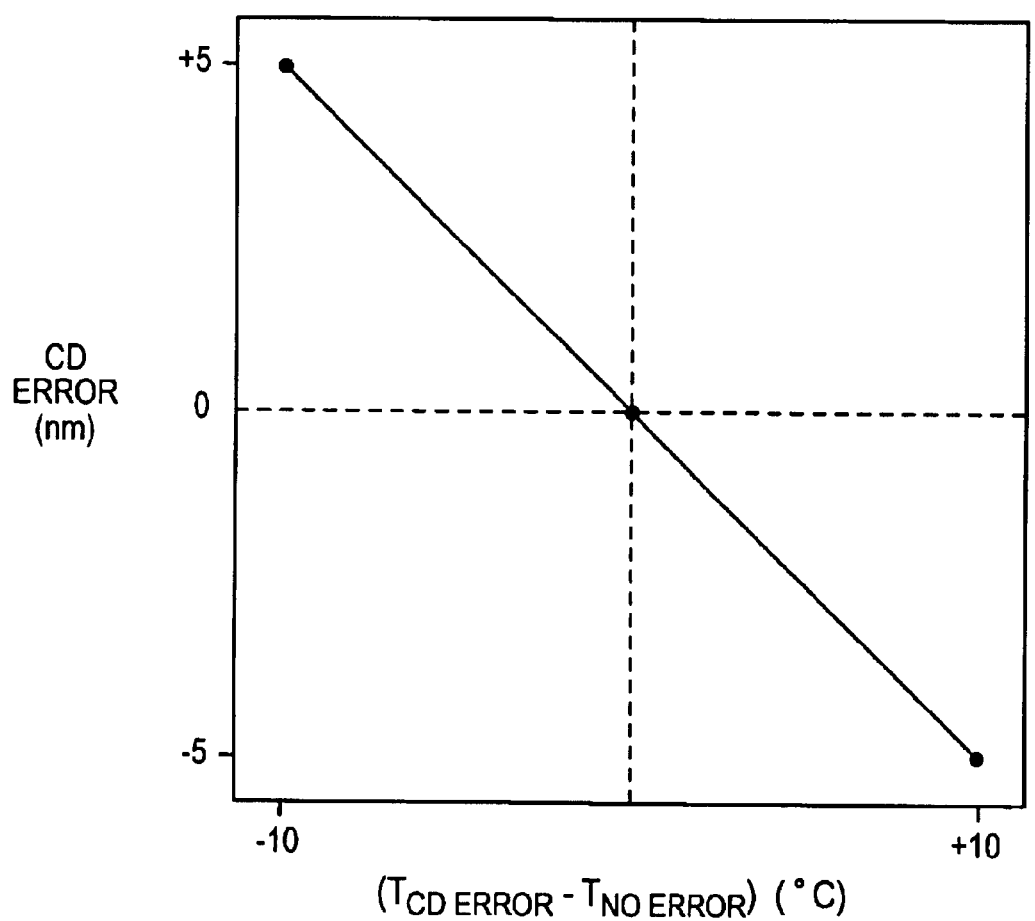
FIG. 10 illustrates an exemplary correlation between critical dimension error and error reducing temperature, according to one embodiment.

FIG. 10 conceptually represents an exemplary correlation that may be used to determine a CD error reducing temperature for a system like system 800 including a negative type, chemically amplified resist such as the Shipley SAL resist, according to one embodiment. The exemplary correlation may pertain to a time one minute after ramping according to the ramping profile shown in FIG. 9.

The correlation relates a magnitude of a CD error and a difference between a CD error reducing temperature ($T_{CD\ error}$) and a baseline temperature corresponding to a conceptual CD having zero error ($T_{No\ error}$). For example, an oversizing error of magnitude +5 may correspond to a CD error reducing temperature that is 10° C. cooler compared with a conceptual zero CD error temperature and an undersizing error of magnitude −5 may correspond to a temperature that is 10° C. hotter compared with the conceptual zero CD error temperature. Such simple linear correlations may be useful especially over a narrow range of CD errors, although more sophisticated nonlinear correlations are contemplated.

Decrease in Amplifying Catalyst Concentration

Figure 11:
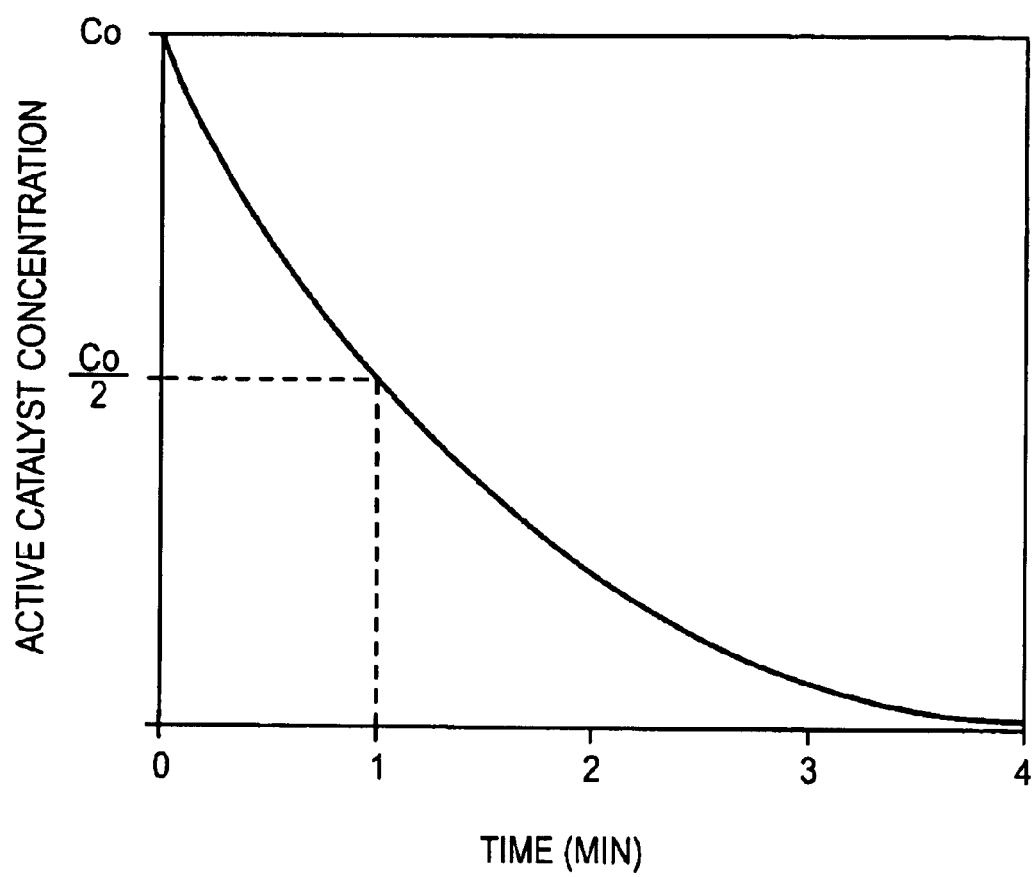
FIG. 11 illustrates an exemplary decrease in active catalyst concentration over time, according to one embodiment.

FIG. 11 shows a decrease in active catalyst concentration over time that may occur in certain negative type, chemically amplified resists. The concentration of active catalyst decreases from an initial concentration ($C_0$) to a near zero over several minutes at elevated temperature. In this particular example, the concentration has decreased to half of the initial concentration (i.e., $C_0/2$) at about 1 minute after temperature ramping begins and has decreased to near zero at about 4 minutes after temperature ramping begins. Without limitation, such decrease in active catalyst concentration may be due to thermal decomposition, steric hindrance, or both. Those having an ordinary level of skill in the art and the benefit of the present disclosure will appreciate that the applicability of the invention is not limited to exposure image modifications based on decreasing catalyst concentration, since the invention is more generally applicable to any post exposure transformation that has a temperature dependency.

Screw Spacer

Figure 12:
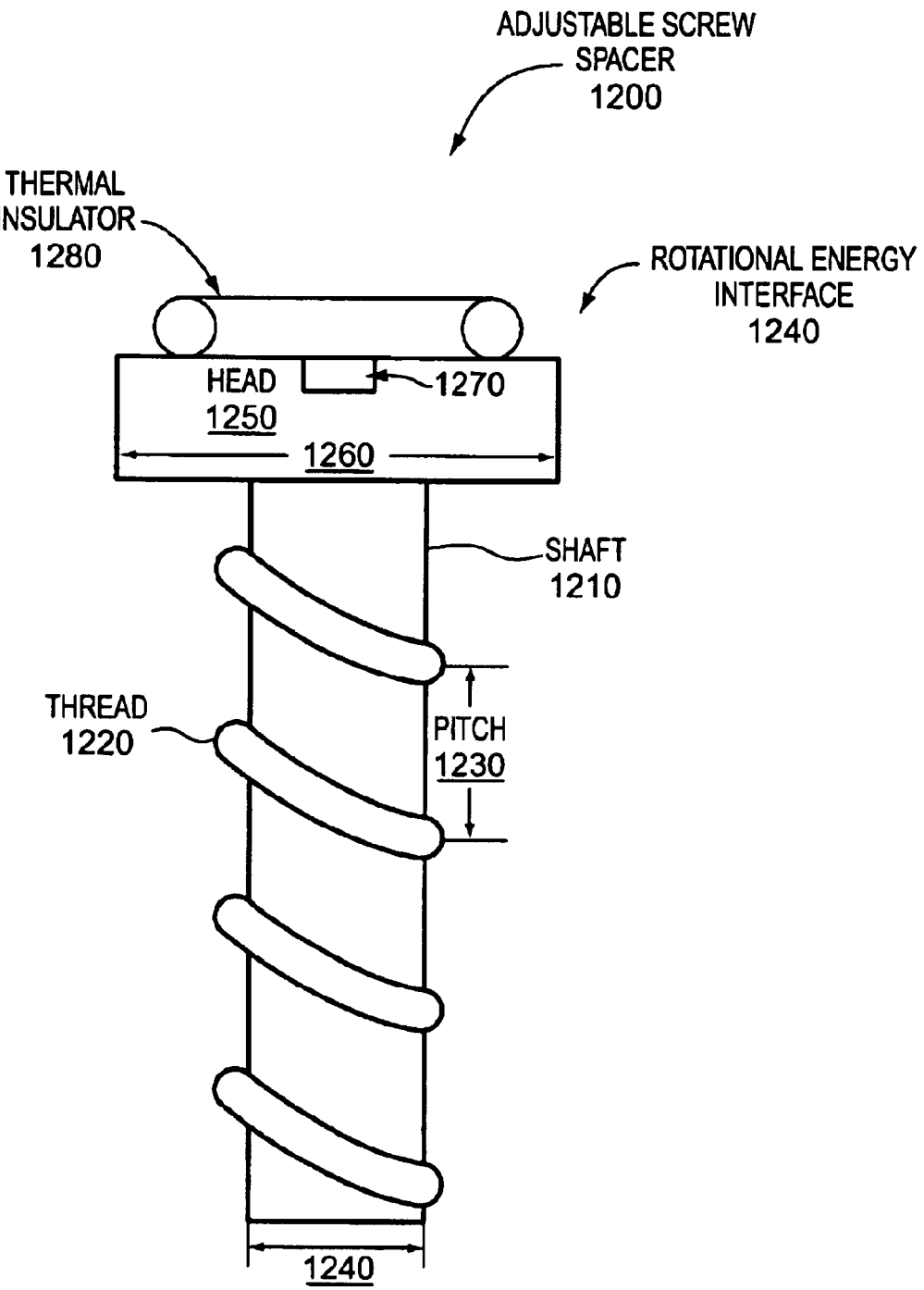
FIG. 12 illustrates an adjustable screw spacer, according to one embodiment.

FIG. 12 shows an exemplary adjustable screw spacer 1200, according to one embodiment. The term "screw" will be used to broadly refer to a device to create substantially linear motion based on rotational energy input. The screw has a cylindrical shaft 1210 and an inclined plane thread 1220 coupled with and spiraling around the shaft. The thread may be adhered to the shaft or carved from the shaft, as desired. The thread has at least one pitch length 1230, which may be between approximately 0.1 and 1 millimeter, depending on the particular implementation. Shorter pitch lengths may be desired for very fine height adjustment and longer pitch lengths may be desired for very course height adjustment. Longer pitch lengths may be more durable and more economical to manufacture, although shorter pitch lengths may provide more accuracy. Embodiments with multiple different pitches and with a pitch that changes along the shaft are also contemplated. The shaft has a diameter 1240 that will typically be between about 1–20 millimeters and preferably be between about 1–10 millimeters.

The exemplary screw adjustable spacer 1200 also has a durable head 1250 that has a diameter 1260 that may be larger than the diameter 1240, such as when the diameter 1240 is at the short end of the provided range. The head 1250 often provides a rotational energy interface 1270, which in this case is at least one slotted groove, to interface or engage with a rotational energy source such as a screwdriver. The screw may also have a low thermal conductivity insulator 1280, which in this case is a polyamide o-ring, to reduce conductive heat transfer between a thermal source at high temperature and a radiation sensitive layer.

The screw adjustable spacer 1200 may be any conventional type of screw. For example, the spacer 1200 may be a slotted-head screw, a leveling screw, a jackscrew, a cap screw, an interrupted screw, a socket-head screw, a round-head screw, a right-hand screw, a left-hand screw, a Phillips machine screw, a Phillips head screw, an Allen screw, a ball screw, a tangent screw, an endless tangent screw, a thumbscrew, a stepped screw, a stage screw, or other types of screws. Advantageously, use of one of these conventional type screws, especially a commercially available conventional type screw, may offer economic advantages. Alternatively, the screw spacer 1200 may be custom or tailored screw that have features and properties that are shown and described, or that would be apparent to one having an ordinary level of skill in the art based on this disclosure. For example, depending on the particular implementation, spacers according to a predetermined design specification may be obtained from Sigmameltec Ltd. of Asao-Ku, Kawasaki, Japan.

Figure 13A:
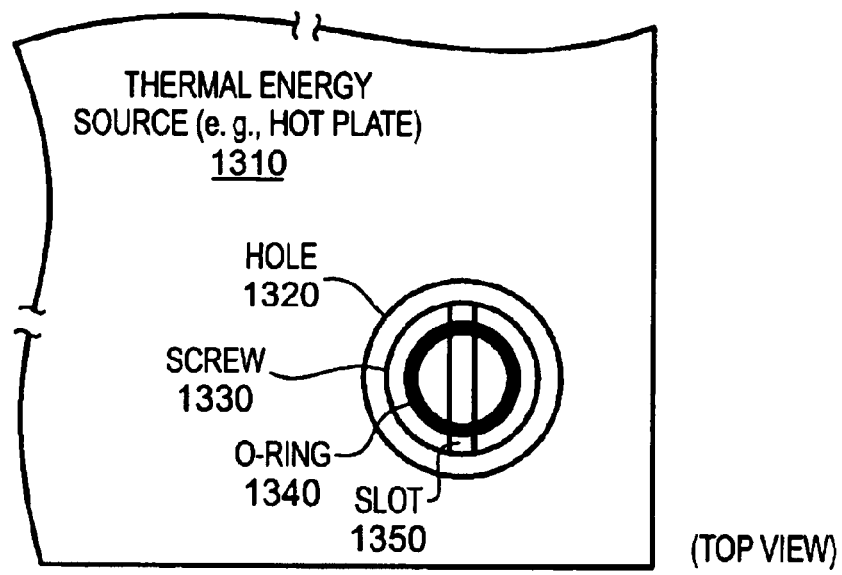
FIGS. 13A–B illustrate a top view and a side view of an adjustable screw spacer screwed into a thermal energy source, according to one embodiment.

FIG. 13A shows a top view of a screw adjustable spacer 1330 screwed into a thermal energy source 1310, according to one embodiment. The thermal energy source may include a hot plate of a post exposure bake oven. The thermal energy source includes a hole 1320 having threadings to rotatably accommodate threads of the spacer 1330. A screwdriver may be inserted into slot 1350 of the spacer 1330 and turned to adjust the screw spacer by way of rotation. A top surface of the head of the screw 1330 is shown. Attached to the top surface is a thermally insulating o-ring 1340 to prevent the top surface of the screw, which may be a better heat conductor than the o-ring (e.g., metal), from contacting a mask placed in position above the thermal energy source.

Figure 13B:
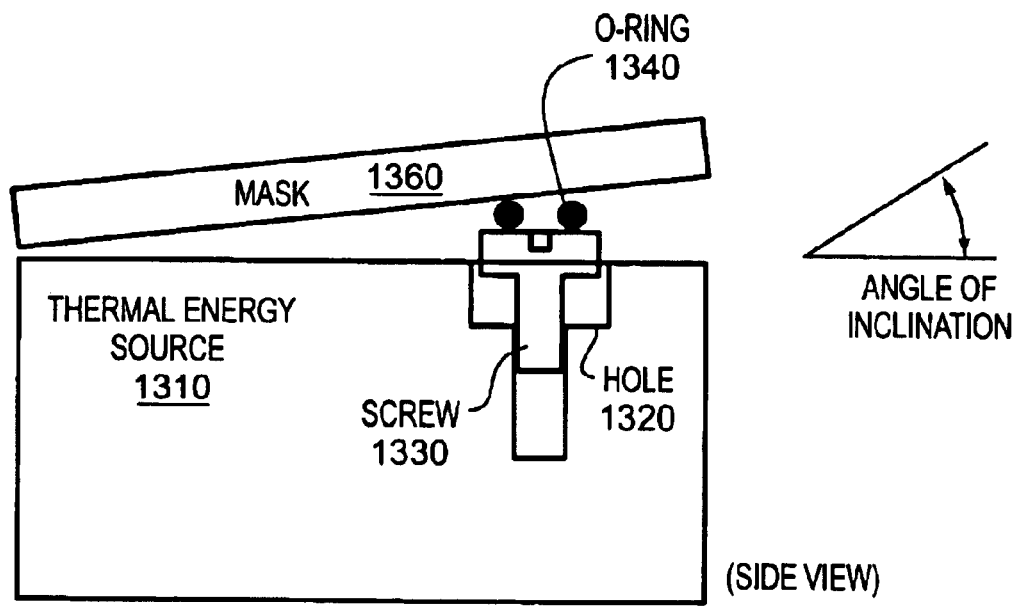

FIG. 13B shows a side view of the screw adjustable spacer 1330 screwed into the thermal energy source 1310, according to one embodiment. As shown, the screw 1330 has been adjusted so that the top surface of the head extends above the tope surface of the thermal energy source and the o-ring 1340 provides further elevation. This in effect increases a separation distance between a radiation sensitive layer, which may exist on a top surface of the mask 1360, and the thermal energy source. As shown, this may also create an angle of inclination between the mask and the top surface of the thermal energy source if other spacers have different adjustments. Such an angle of inclination may lead to heterogeneous radiant heat flux to the mask. The screw may be rotated to obtain other adjustments. In one alternate adjustment both the head of the screw and the o-ring are submersed below the top surface of the thermal energy source. This may be used to return the thermal energy source to an unadjusted state wherein uniform and heterogeneous thermal input is provided to the mask. As shown, the hole 1320 may include enough void to allow such an adjustment.

Figure 14:
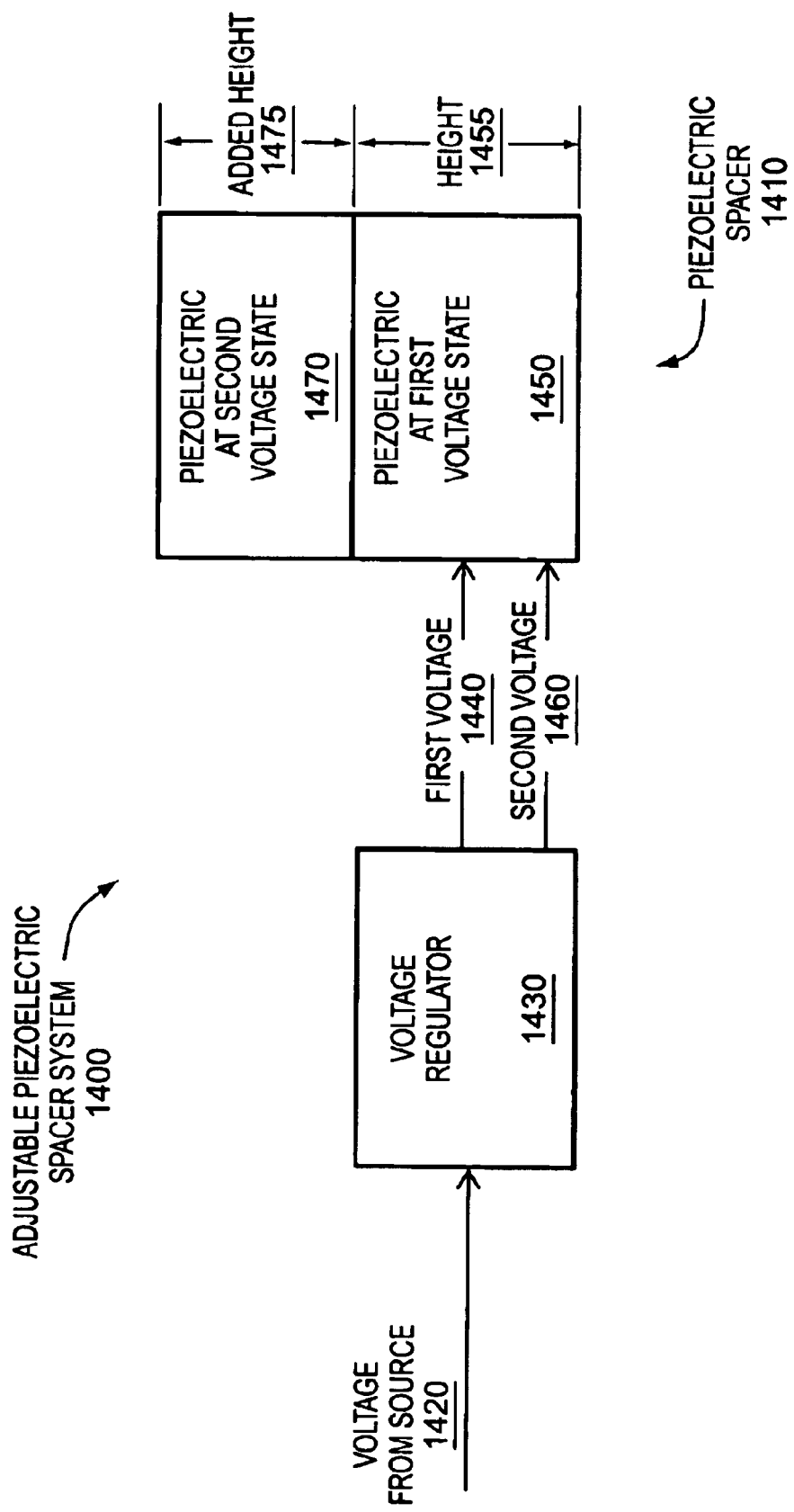
FIG. 14 illustrates an adjustable piezoelectric spacer system, according to one embodiment.

FIG. 14 shows an exemplary piezoelectric adjustable spacer system 1400, according to one embodiment. The spacer system 1400 includes a voltage regulator 1430 to receive a voltage 1420 from a voltage source and to regulate a magnitude of voltage provided to a piezoelectric spacer 1410. The voltage regulator may regulate voltage based on predetermined adjustments or settings (e.g., setpoints) provided by humans or systems. For example, the regulator 1430 may access industrial manufacturing quality control data (e.g., CD errors determined by scanning electron microscope) to determine types and magnitudes of CD errors determined for a particular region associated with the spacer 1410 and may apply predetermined instructions to correlate the data to an output voltage.

After determining an output voltage, the voltage regulator asserts or provides a first voltage 1440 to the piezoelectric spacer 1410. For purposes of illustration, the piezoelectric spacer is shown in a first state 1450 having a first distance or height 1455 that corresponds to the first voltage 1440. By way of example, the first state and the height may reduce a CD undersizing error. The system 1400 is adjustable, such that CD errors of a different type or magnitude are encountered, the voltage regulator may assert or provide a second different voltage 1460 to cause the piezoelectric spacer to have a second state 1470 that in this case has an added distance or height 1475. By way of example, the second state and the height 1475 may reduce a CD oversizing error.

Thermal Modification System with Removable Spacers

Figure 15:
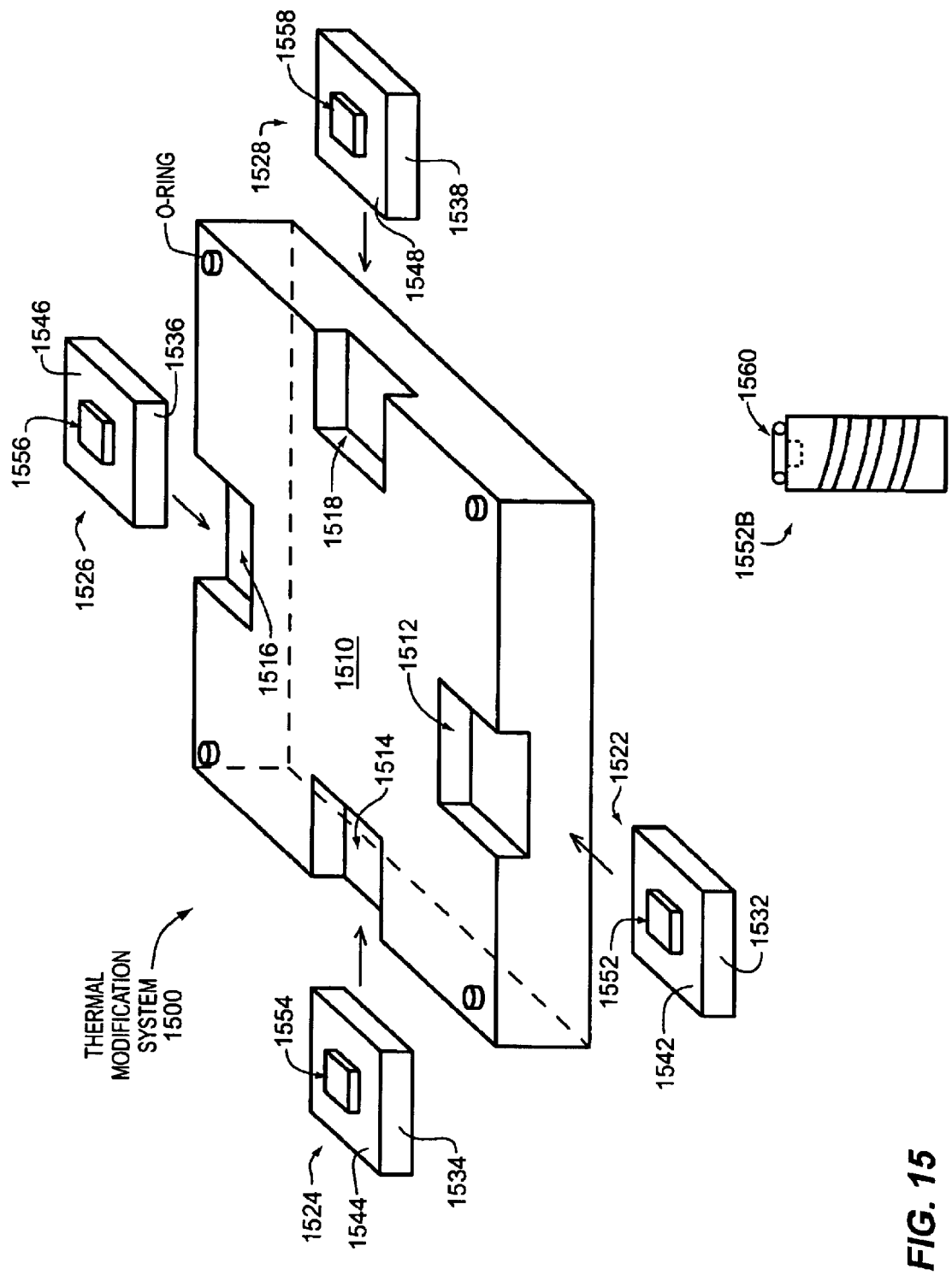
FIG. 15 illustrates a thermal modification system having removable spacers, according to one embodiment.

FIG. 15 shows a thermal modification system 1500 incorporating removable spacers, according to one embodiment. The system includes a thermal energy source 1510, which may be a hot plate such as conventionally used in post exposure baking operations. The thermal energy source has four voids 1512, 1514, 1516, and 1518 each configured to receive one of removable spacing systems 1522, 1524, 1526, and 1528 and in particular solids 1532, 1534, 1536, and 1538. The void 1512 may be a cubic, rectangular solid, cylindrical, triangular, or other form of void of the source 1510 to accommodate a corresponding approximately equally sized and shaped solid 1532 of the spacing system 1522 to fit within the void 1512 typically with a good, snug, and consistent fitting to encourage reliable performance of the system 1500. As shown, the void 1512 may be along a side of the source 1510. Alternatively, the void 1512 may be located at another extremity, such as a corner, or at an interior location. The spacing system 1522 may be made of the same material as the source 1510 or of a different material. Typically, when the materials are different, the coefficients of thermal expansion for the materials will be sufficiently close to avoid stresses and inconsistencies during temperature ramping.

Each of the spacing systems 1522, 1524, 1526, and 1528 may have a spacer 1552, 1554, 1556, and 1558 that extends above a respective functional top surface 1542, 1544, 1546, and 1548. The top surfaces 1542–1548 may be substantially coplanar with a top functional surface of the source 1510, or they may be elevated or de-elevated with respect to the top surface of the source 1510, as desired. The spacers 1552–1558 may provide a variable thermal input to a radiation sensitive layer for the system 700, the system 800, or both.

According to one embodiment, the spacers 1552–1558 are adjustable. For example, the spacer 1552 may be a screw spacer 1552B that is adjustable by rotation. The solid 1532 may have a cylindrical void (not shown) that may open through a circular opening in the surface 1542. The cylindrical void may have structure corresponding to a thread and shaft of the screw spacer 1552B. The spacer 1552 may also have a thermal insulator, such as a polyamide o-ring 1560. Such a system 1522 incorporating the spacer 1552B may be used by removing the solid 1532 from the void 1512, accurately adjusting the spacer 1552B with a screwdriver so that the spacer 1552B provides a desired distance relative to a top functional surface of the source 1510, accurately measuring the desired distance if desired, and replacing the solid 1532 back into the void 1512 prior to use.

Alternatively, rather than adjustable spacing systems 1522–1528, the systems 1522–1528 may be predetermined spacing systems having predetermined different separation distance heights that are not adjustable. A plurality of such predetermined systems may be provided to be useful for different magnitudes and types of CD error reduction, so that one spacing system having a desired separation distance height may be selected and used without adjustment.

Thermal Modification System to Allow in Situ Adjustment

Figure 16:
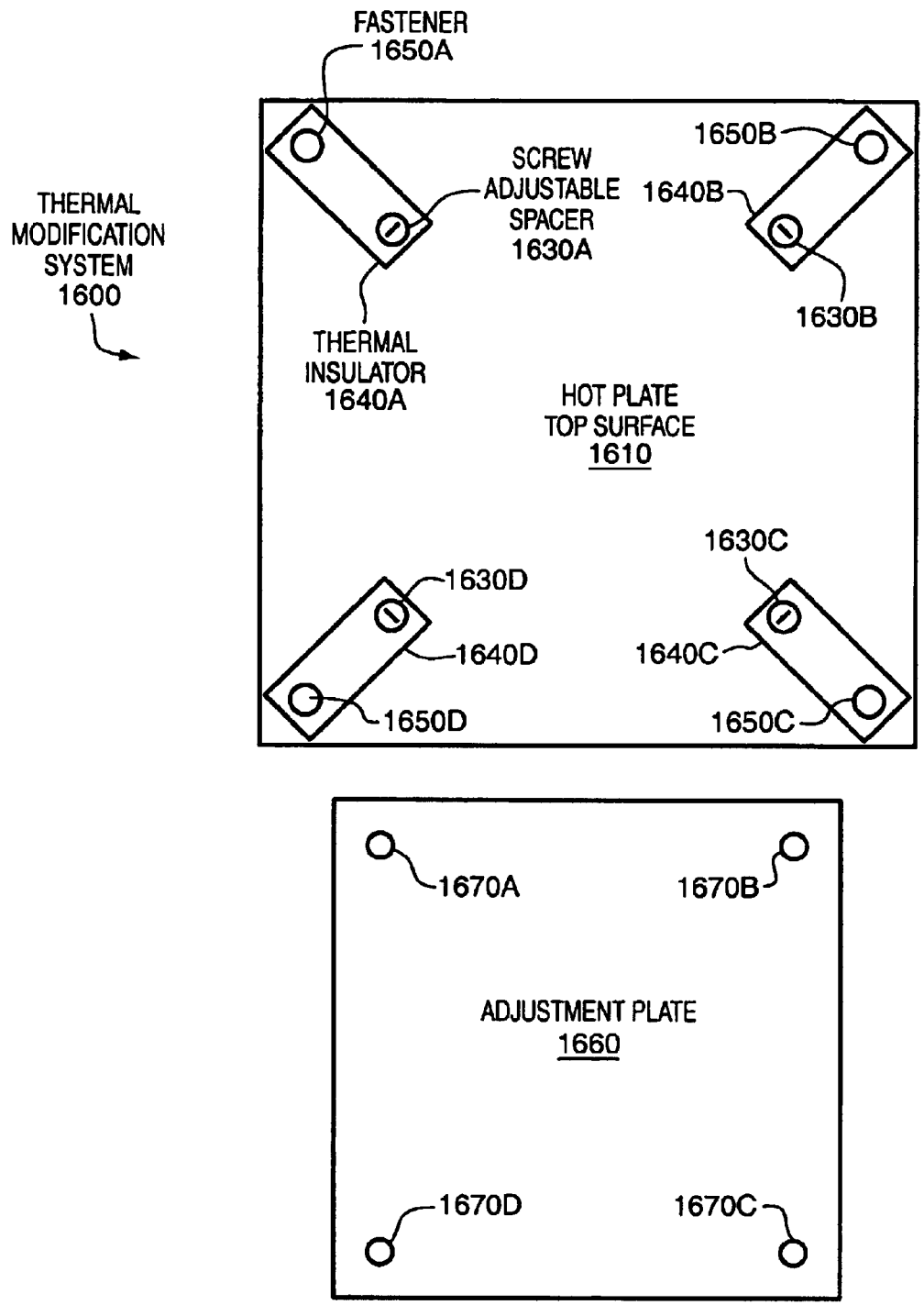
FIG. 16 illustrates a top view of a thermal modification system having a screw adjustable spacer and an adjustment plate with an opening hole to allow adjustment of the spacer, according to one embodiment.

FIG. 16 shows a top view of a thermal modification system 1600 that allows rapid screw spacer adjustment via an adjustment plate that has openings (in this case holes) to allow adjustment, according to one embodiment. The system includes a hot plate having a top surface 1610 having four screw adjustable spacers 1630A–D screwed therein, four thermal insulators 1640A–D attached to the top surface by fasteners 1650A–D and in contact with a top surface of the four screw adjustable spacers, and an adjustment plate 1660 having holes 1670A–D to allow in situ adjustment of the screw spacers 1630A–D when the adjustment plate is positioned above top surface.

The hotplate has the top surface 1610 that is typically at least as large as a mask to be thermally treated so that heat can be provided from the top surface to all regions of the mask. Embedded within the hot plate are four holes having screw threads to accommodate the screw spacers.

The four screw spacers 1630A–D are screwed into the four holes. The screw spacers have a head having a top surface to support the thermal insulators 1640A–D and having a slot to allow them to be adjusted by rotation with a screwdriver or other means. The screw spacers may be rotated to place the top surface of the head in different positions relative to the top surface of the hot plate. The different positions include a first position wherein the head top surface extends above the top surface of the hot plate and a second position wherein the head top surface is positioned below the top surface of the hot plate. In the first position the top surface of the screw head lifts the thermal insulator from the top surface of the hot plate and in effect adds separation distance between either an adjustment plate or mask placed on the hot plate surface.

The thermal insulators 1640A–D are attached to the hot plate top surface 1610 by fasteners 1650A–D (e.g., bolts, screws, rivots, staples, nails, glue, or other desired fastener means). The thermal insulators may be small sheets (e.g., rectangular strips) of thin (e.g., less than 200 micrometers or less than 100 micrometers), flexible, thermally stable, thermally insulating material to prevent direct contact between conducting portions of the hotplate and screw adjustable spacers and the mask placed in position above the hotplate top surface to reduce thermal conduction. When the screw spacers are adjusted to sit below the top surface of the hotplate the thermal insulators may rest upon the top surface of the hotplate. When the screw spacers are adjusted to protrude above the top surface of the hotplate they may lift the thermal insulators off the hotplate top surface. The thermal insulators have holes (through which the screw spacers are seen) that have a diameter less than the diameter of the heads of the screw spacers so as to engage with and rest upon the top of the screw spacers but large enough to allow slot access and adjustment by a screwdriver or other means.

A variety of thermally insulating materials are contemplated for the thermal insulators 1640A–D. For example, the thermal insulators may include films of polymeric materials, polymeric foams, composite materials, low conductivity ceramics and glasses, fabrics or weaves of insulating materials, fiberglass, asbestos pads, ceramic fibers, metal matrix composites, and others. Desirable qualities of the material of the thermal insulator include wide availability, prior successful use in similar environments, thermal stability over at least the temperature range between about 25° C. and about 120° C., stable and low thermal conductivity between about 25° C. and about 120° C., and stable and low coefficient of thermal expansion between about 25° C. and about 120° C.

According to one embodiment, the thermal insulators 1640A–D comprise Kapton® polyimide film available from DuPont High Performance Materials which is a subsidiary of E. I. du Pont de Nemours and Company (DuPont) of Wilmington, Del. Such films are thin (e.g., about 25 $\mu$m or about 70 $\mu$m), thermally stable over a wide range of temperatures (e.g., between about −269° C. and about 400° C.), good insulators (coefficient of thermal conductivity between about 0.1–0.5 W/m/° C.), and provide sufficient thermal insulation even when applied as a thin film.

The adjustment plate 1660 has holes 1670A–D that positionally correspond to the screw spacers 1630A–D to allow the screw spacers to be rotated and adjusted with the adjustment plate placed in situ above the hotplate top surface. The adjustment plate may be substantially similar in length, width, and thickness to a mask to be fabricated. Configuring the spacers 1630A–D with the adjustment plate may include operations such as the following: (a) placing the adjustment plate in position on the top operational surface of the hotplate, (b) adjusting the screw adjustable spacers through holes in the adjustment plate, (c) using a distance determination system to measure multiple distances between the top surface of the adjustment plate and the top surface of the hotplate proximate each of the screw spacers 1630A–D, (d) determining whether further adjustment is needed to reach the desired configuration, (e) repeating steps (b), (c), and (d) until the desired adjustment is achieved, and (f) removing the adjustment plate from the top operational surface. Advantageously, such use of an adjustment plate having holes may allow the screw spacers to be adjusted rapidly with coordinated simultaneous distance determination. Without such an adjustment plate, adjusting the screw spacers may involve iterative and time consuming operations to place the mask in position for purposes of measuring a distance and remove the mask for purposes of making an adjustment.

Figure 17:
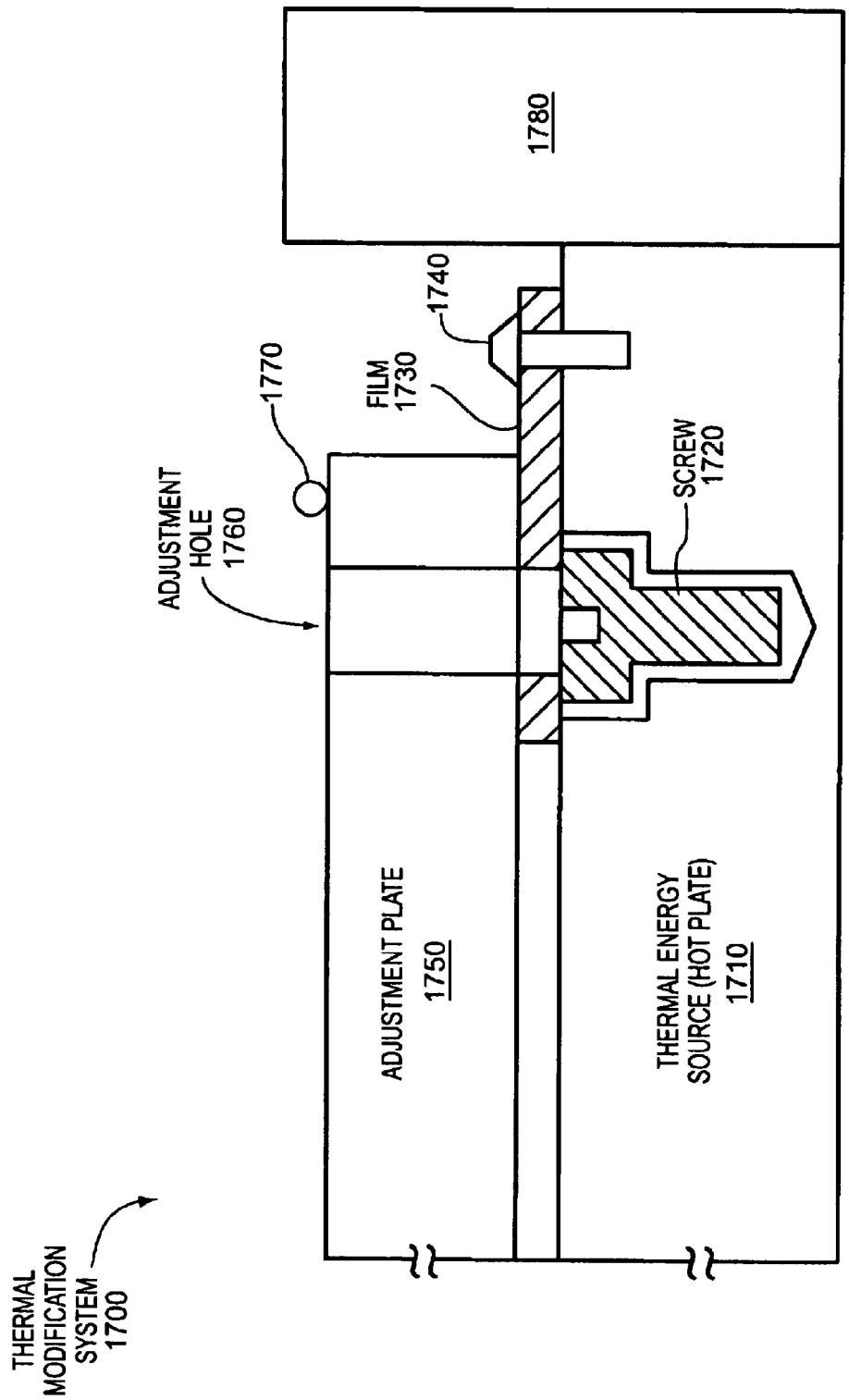
FIG. 17 illustrates a side view portion of a thermal modification system having a screw adjustable spacer and an adjustment plate with an opening hole to allow adjustment of the spacer, according to one embodiment.

FIG. 17 shows a side view of a portion of a thermal modification system 1700 including an adjustment plate 1750 with an opening such as a hole 1760 to provide access to and adjustment of a screw spacer 1720 when the adjustment plate is placed in situ in position above a thermal energy source 1710 (e.g., a hot plate), according to one embodiment. The system also includes a sheet of thermal insulating film 1730 attached to the thermal energy source by a fastener 1740 and in contact with a top operational surface of the thermal energy source and with a top surface of the screw. A particular adjustment of the spacer 1720 is shown although other adjustments are contemplated, including those wherein the screw spacer, the insulating film, and the adjustment plate are moved in the vertical direction by rotating the screw spacer so that its top surface extends above the top surface of the thermal energy source. The system also includes a distance determination system 1770 to determine a separation distance by sensing a position of a top surface of the adjustment plate including any separation distance caused by the screw adjustable spacer.

Alternate Embodiments

The invention is not limited to the particular context and examples described above. As an example, according to one alternate embodiment, the invention may be used to modify an exposure image in a radiation sensitive layer for purposes other than mask fabrication. For example, an exposure image attached with a silicon wafer of a semiconductor logic product under manufacture based on lithographic exposure via a mask may be modified by a variable post exposure thermal treatment. Other embodiments are contemplated as will be apparent to a person having an ordinary level of skill in the art and having the benefit of the present disclosure.

In conclusion, the present invention provides a system and method for modifying an exposure image in a radiation sensitive layer by providing a non-uniform heterogeneous thermal energy input to the exposure image.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A system comprising:
   a thermal energy source having a top surface to provide radiant heat to a radiation sensitive layer applied to a mask substrate when the mask substrate is placed above the top surface;
   a screw adjustable spacer rotationally coupled to the thermal energy source to adjust a separation distance between the radiation sensitive layer and the top surface by rotating to a position wherein a top of the screw adjustable spacer is above the top surface of the thermal energy source; and
   an adjustment plate to be placed above the top surface of the thermal energy source before the mask substrate and having an opening aligned with the screw adjustable spacer to allow the screw adjustable spacer to be rotated.

2. The system of claim 1, further comprising:
   a plurality of additional screw adjustable spacers rotationally coupled to the thermal energy source to adjust a plurality of separation distances between the radiation sensitive layer and the top surface by rotating to different positions wherein tops of the additional screw adjustable spacers are above the top surface of the thermal energy source; and
   a plurality of additional openings housed in the adjustment plate that are aligned with the additional screw adjustable spacers to allow the additional screw adjustable spacer to be rotated.

3. The system of claim 2, wherein the plurality of additional openings comprise a hole housed in the adjustment plate at an extremity of the adjustment plate.

4. The system of claim 1, further comprising a thermal insulator fastened to the thermal energy source to contact the screw adjustable spacer in the position wherein the top of the screw adjustable spacer is above the top surface of the thermal energy source.

5. The system of claim 4, wherein the thermal insulator comprises a sheet of polyimide film having a thickness that is less than about 200 micrometers.

6. A system comprising:
an adjustable thermal modification system to heat a radiation sensitive layer applied to a mask substrate, the adjustable thermal modification system containing an adjustable spacer operable to be adjusted to displace the mask substrate when the mask substrate is positioned in the thermal modification system; and
an adjustment plate having an opening to allow access to and adjustment of the adjustable spacer when the adjustable spacer is positioned in the thermal modification system.

7. The system of claim 6:
wherein the adjustable spacer comprises a screw adjustable spacer; and
wherein the adjustment plate opening is smaller than a head of the screw adjustable spacer.

8. The system of claim 6, further comprising a thermal insulator means to reduce conductive heat transfer between the screw adjustable spacer and the mask substrate.

9. A system comprising:
a thermal energy source to heat a mask substrate having an exposed radiation sensitive layer, wherein the thermal energy source has a top surface having a size at least as large as the mask substrate, and wherein the thermal energy source has a plurality of screw holes at different locations on the top surface;
a plurality of screw adjustable spacers screwed into the plurality of screw holes, wherein the screw adjustable spacers have a head having a slot and a head top surface, wherein the screw adjustable spacers are operable to be rotated to move the head top surface relative to the hotplate top surface and are operable to be rotated to extend the head top surface above the hotplate top surface; and
a plurality of thermal insulators fastened to the thermal energy source, wherein each of the thermal insulators has a top surface to contact the mask substrate and a bottom surface to contact a head top surface of a corresponding screw adjustable spacer, wherein each of the thermal insulators has a hole to provide access to a slot of a corresponding screw adjustable spacer.

10. The system of claim 9:
further comprising an adjustment plate to allow adjustment of the plurality of screw adjustable spacers prior to heating the mask substrate,
wherein the adjustment plate has a thickness that is substantially similar to a thickness of the mask substrate,
wherein the adjustment plate has a bottom surface to contact the top surfaces of the plurality of thermal insulators, and
wherein the adjustment plate has a plurality of holes that each correspond to a hole of a thermal insulator to provide access to a slot of a corresponding screw adjustable spacer.

11. The system of claim 9, wherein the plurality of thermal insulators comprise a polymeric film having a thickness that is less than about 100 micrometers.

12. The system of claim 11, wherein the polymeric film comprises polyimide.

13. An adjustment plate comprising an opening to allow access to and adjustment of an adjustable spacer of a thermal modification system when the adjustment plate is positioned above a top operational surface of the thermal modification system.

14. The adjustment plate of claim 13, wherein the adjustment plate comprises a plurality of openings to allow access to and adjustment of a plurality of adjustable spacers of the thermal modification system when the adjustment plate is positioned above a top operational surface of the thermal modification system, wherein the plurality of openings include a hole housed in the adjustment plate.

15. The adjustment plate of claim 13:
wherein the adjustable spacer comprises a screw adjustable spacer, the screw adjustable spacer having a head having a head diameter and an interface for rotational engagement; and
wherein the opening of the adjustment mask has a diameter that is sufficiently large to allow access to and rotational adjustment of the screw adjustable spacer and smaller than the head diameter.

16. The adjustment plate of claim 13, wherein a thickness of the adjustment plate is substantially similar to a thickness of a mask substrate having an exposure image to be modified by the thermal modification system.

17. The adjustment plate of claim 13, further comprising plurality of additional openings to allow access to and adjustment of a plurality of additional adjustable spacers of the thermal modification system.

* * * * *